US00RE48963E

(19) United States
(12) Reissued Patent
Bathiche et al.

(10) Patent Number: US RE48,963 E
(45) Date of Reissued Patent: Mar. 8, 2022

(54) CONNECTION DEVICE FOR COMPUTING DEVICES

(71) Applicant: Microsoft Technology Licensing, LLC, Redmond, WA (US)

(72) Inventors: Steven Nabil Bathiche, Kirkland, WA (US); Flavio Protasio Ribeiro, Bellevue, WA (US); Nigel Stuart Keam, Redmond, WA (US); Bernard K. Rihn, Snohomish, WA (US); Panos C. Panay, Redmond, WA (US); David W. Voth, Woodinville, WA (US)

(73) Assignee: Microsoft Technology Licensing, LLC, Redmond, WA (US)

(21) Appl. No.: 16/846,055

(22) Filed: Apr. 10, 2020

Related U.S. Patent Documents

Reissue of:
(64) Patent No.: 9,426,905
Issued: Aug. 23, 2016
Appl. No.: 13/891,109
Filed: May 9, 2013

U.S. Applications:
(63) Continuation-in-part of application No. 13/470,633, filed on May 14, 2012, now Pat. No. 8,498,100.
(Continued)

(51) Int. Cl.
*G06F 1/16* (2006.01)
*H01R 11/30* (2006.01)
(Continued)

(52) U.S. Cl.
CPC ..... *G06F 1/1683* (2013.01); *G06F 1/1626* (2013.01); *G06F 1/1637* (2013.01);
(Continued)

(58) Field of Classification Search
CPC .... G06F 1/1654; G06F 1/1669; G06F 1/1618; G06F 1/1683; G06F 1/1637; G06F 1/1616
See application file for complete search history.

(56) References Cited

U.S. PATENT DOCUMENTS 578,325 A 3/1897 Fleming
3,600,528 A 8/1971 Leposavic
(Continued)

FOREIGN PATENT DOCUMENTS

CA 990023 6/1976
CN 1653411 8/2005
(Continued)

OTHER PUBLICATIONS

"Office Action Issued in Korean Patent Application No. 10-2020-7016522", dated Jul. 25, 2020, 26 Pages.
(Continued)

*Primary Examiner* — Terrence R Till
(74) *Attorney, Agent, or Firm* — Ray Quinney & Nebeker P.C.; Paul N. Taylor

(57) ABSTRACT

A connection device for computing devices is described. In one or more implementations, a connection device comprises a plurality of connection portions that are physically and communicatively coupled, one to another. Each of the plurality of connection portions has at least one communication contact configured to form a communicative coupling with a respective one of a plurality of computing devices and with at least one other communication contact of another one of the connections portions to support communication between the plurality of computing devices. Each of the plurality of connection portions also includes a magnetic coupling device to form a removable magnetic attachment to the respective one of the plurality of computing devices.

18 Claims, 12 Drawing Sheets

Related U.S. Application Data

(60) Provisional application No. 61/606,321, filed on Mar. 2, 2012, provisional application No. 61/606,301, filed on Mar. 2, 2012, provisional application No. 61/606,313, filed on Mar. 2, 2012, provisional application No. 61/606,333, filed on Mar. 2, 2012, provisional application No. 61/613,745, filed on Mar. 21, 2012, provisional application No. 61/606,336, filed on Mar. 2, 2012, provisional application No. 61/607,451, filed on Mar. 6, 2012.

(51) Int. Cl.
*H01R 13/62* (2006.01)
*H05K 5/00* (2006.01)

(52) U.S. Cl.
CPC ..... *G06F 1/1654* (2013.01); *G06F 1/1679* (2013.01); *G06F 1/1681* (2013.01); *G06F 1/1692* (2013.01); *H01R 11/30* (2013.01); *H01R 13/6205* (2013.01); *H05K 5/0086* (2013.01)

(56) References Cited

U.S. PATENT DOCUMENTS 3,777,082 A 12/1973 Hatley
3,879,586 A 4/1975 DuRocher et al.
3,968,336 A 7/1976 Johnson
4,046,975 A 9/1977 Seeger, Jr.
4,065,649 A 12/1977 Carter et al.
4,086,451 A 4/1978 Boulanger
4,243,861 A 1/1981 Strandwitz
4,279,021 A 7/1981 See et al.
4,302,648 A 11/1981 Sado et al.
4,317,013 A 2/1982 Larson
4,323,740 A 4/1982 Balash
4,326,193 A 4/1982 Markley et al.
4,365,130 A 12/1982 Christensen
4,375,018 A 2/1983 Petersen
4,420,744 A 12/1983 Jesson
4,492,829 A 1/1985 Rodrique
4,503,294 A 3/1985 Matsumaru
4,527,021 A 7/1985 Morikawa et al.
4,559,426 A 12/1985 Van Zeeland et al.
4,577,822 A 3/1986 Wilkerson
4,588,187 A 5/1986 Dell
4,602,135 A 7/1986 Phalen
4,607,147 A 8/1986 Ono et al.
4,651,133 A 3/1987 Ganesan et al.
4,652,704 A 3/1987 Franklin
4,684,767 A 8/1987 Phalen
4,724,605 A 2/1988 Fiorella
4,735,394 A 4/1988 Facco
4,795,977 A * 1/1989 Frost ..... G01R 1/073 324/537
4,801,771 A 1/1989 Mizuguchi et al.
4,824,268 A 4/1989 Diernisse H. V.
4,864,084 A 9/1989 Cardinale
5,008,497 A 4/1991 Asher
5,021,638 A 6/1991 Nopper et al.
5,107,401 A 4/1992 Youn
5,128,829 A 7/1992 Loew
5,138,119 A 8/1992 Demeo
5,204,517 A 4/1993 Cates et al.
5,218,177 A 6/1993 Coleman et al.
5,220,318 A 6/1993 Staley
5,220,521 A 6/1993 Kikinis
5,235,495 A 8/1993 Blair et al.
5,253,362 A 10/1993 Nolan et al.
5,283,559 A 2/1994 Kalendra et al.
5,331,443 A 7/1994 Stanisci
5,340,528 A 8/1994 Machida et al.
5,363,075 A 11/1994 Fanucchi
5,375,076 A 12/1994 Goodrich et al.
5,404,133 A 4/1995 Moriike et al.
5,480,118 A 1/1996 Cross
5,491,313 A 2/1996 Bartley et al.
5,510,783 A 4/1996 Findlater et al.
5,546,271 A 8/1996 Gut et al.
5,548,477 A 8/1996 Kumar et al.
5,558,577 A 9/1996 Kato
5,574,447 A 11/1996 Roylance
5,576,981 A 11/1996 Parker et al.
5,581,682 A 12/1996 Anderson et al.
5,596,700 A 1/1997 Darnell et al.
5,618,232 A 4/1997 Martin
5,661,279 A 8/1997 Kenmochi
5,666,112 A 9/1997 Crowley et al.
5,681,220 A 10/1997 Bertram et al.
5,737,183 A 4/1998 Kobayashi et al.
5,745,376 A 4/1998 Barker et al.
5,748,114 A 5/1998 Koehn
5,781,406 A 7/1998 Hunte
5,803,748 A 9/1998 Maddrell et al.
5,807,175 A 9/1998 Davis et al.
5,818,361 A 10/1998 Acevedo
5,828,770 A 10/1998 Leis et al.
5,842,027 A 11/1998 Oprescu et al.
5,861,990 A 1/1999 Tedesco
5,874,697 A 2/1999 Selker et al.
5,905,485 A 5/1999 Podoloff
5,920,317 A 7/1999 McDonald
5,924,555 A 7/1999 Sadamori et al.
5,926,170 A 7/1999 Oba
5,957,191 A 9/1999 Okada et al.
5,971,635 A 10/1999 Wise
6,002,389 A 12/1999 Kasser
6,002,581 A 12/1999 Lindsey
6,005,209 A 12/1999 Burleson et al.
6,012,714 A 1/2000 Worley et al.
6,040,823 A 3/2000 Seffernick et al.
6,042,075 A 3/2000 Burch, Jr.
6,044,717 A 4/2000 Biegelsen et al.
6,061,644 A 5/2000 Leis
6,108,200 A 8/2000 Fullerton
6,112,797 A 9/2000 Colson et al.
6,128,007 A 10/2000 Seybold
6,137,675 A * 10/2000 Perkins ..... G06F 1/163 128/876
6,141,388 A 10/2000 Servais et al.
6,147,859 A 11/2000 Abboud
6,178,085 B1 1/2001 Leung
6,178,443 B1 1/2001 Lin
6,188,391 B1 2/2001 Seely et al.
6,198,474 B1 3/2001 Roylance
6,228,926 B1 5/2001 Golumbic
6,254,105 B1 7/2001 Rinde et al.
6,266,685 B1 7/2001 Danielson et al.
6,279,060 B1 8/2001 Luke et al.
6,305,073 B1 10/2001 Badders
6,329,617 B1 12/2001 Burgess
6,344,791 B1 2/2002 Armstrong
6,366,440 B1 4/2002 Kung
6,380,497 B1 4/2002 Hashimoto et al.
6,437,682 B1 8/2002 Vance
6,442,764 B1 9/2002 Badillo et al.
6,450,046 B1 9/2002 Maeda
6,469,755 B1 10/2002 Adachi et al.
6,506,983 B1 1/2003 Babb et al.
6,511,378 B1 1/2003 Bhatt et al.
6,532,147 B1 3/2003 Christ, Jr.
6,543,949 B1 4/2003 Ritchey et al.
6,565,439 B2 5/2003 Shinohara et al.
6,585,435 B2 7/2003 Fang
6,597,347 B1 7/2003 Yasutake
6,600,121 B1 7/2003 Olodort et al.
6,603,408 B1 8/2003 Gaba
6,603,461 B2 8/2003 Smith, Jr. et al.
6,608,664 B1 8/2003 Hasegawa
6,617,536 B2 9/2003 Kawaguchi
6,651,943 B2 11/2003 Cho et al.
6,675,865 B1 1/2004 Yoshida
6,684,166 B2 1/2004 Bellwood et al.

(56) References Cited

U.S. PATENT DOCUMENTS 6,685,369 B2 2/2004 Lien
6,687,614 B2 2/2004 Ihara et al.
6,695,273 B2 2/2004 Iguchi
6,704,864 B1 3/2004 Philyaw
6,721,019 B2 4/2004 Kono et al.
6,725,318 B1 4/2004 Sherman et al.
6,738,049 B2 5/2004 Kiser et al.
6,758,615 B2 7/2004 Monney et al.
6,774,888 B1 8/2004 Genduso
6,776,546 B2 8/2004 Kraus et al.
6,780,019 B1 8/2004 Ghosh et al.
6,781,819 B2 8/2004 Yang et al.
6,784,869 B1 8/2004 Clark et al.
6,798,887 B1 9/2004 Andre
6,813,143 B2 11/2004 Makela
6,819,316 B2 11/2004 Schulz et al.
6,819,547 B2 11/2004 Minaguchi et al.
6,856,506 B2 2/2005 Doherty et al.
6,856,789 B2 2/2005 Pattabiraman et al.
6,861,961 B2 3/2005 Sandbach et al.
6,864,573 B2 3/2005 Robertson et al.
6,882,337 B2 4/2005 Shetter
6,898,315 B2 5/2005 Guha
6,909,354 B2 6/2005 Baker et al.
6,914,197 B2 7/2005 Doherty et al.
6,948,136 B2 9/2005 Trewin
6,950,950 B2 9/2005 Sawyers et al.
6,962,454 B1 11/2005 Costello
6,970,957 B1 11/2005 Oshins et al.
6,976,799 B2 12/2005 Kim et al.
7,007,238 B2 2/2006 Glaser
7,018,678 B2 3/2006 Gronbeck et al.
7,051,149 B2 5/2006 Wang et al.
7,066,634 B2 6/2006 Kitamura et al.
7,068,496 B2 6/2006 Wong et al.
7,083,295 B1 8/2006 Hanna
7,091,436 B2 8/2006 Serban
7,091,955 B2 8/2006 Kramer
7,095,404 B2 8/2006 Vincent et al.
7,099,149 B2 8/2006 Krieger et al.
7,106,222 B2 9/2006 Ward et al.
7,116,309 B1 10/2006 Kimura et al.
7,123,241 B2 10/2006 Bathiche
7,123,292 B1 10/2006 Seeger et al.
7,136,282 B1 11/2006 Rebeske
7,152,985 B2 12/2006 Benitez et al.
D535,292 S 1/2007 Shi et al.
7,169,460 B1 1/2007 Chen et al.
7,194,662 B2 3/2007 Do et al.
7,201,508 B2 4/2007 Misaras
7,202,837 B2 4/2007 Ihara
7,213,323 B2 5/2007 Baker et al.
7,213,991 B2 5/2007 Chapman et al.
7,218,830 B2 5/2007 Iimura
7,224,830 B2 5/2007 Nefian et al.
7,239,505 B2 7/2007 Keely et al.
7,252,512 B2 8/2007 Tai et al.
7,260,221 B1 8/2007 Atsmon
7,277,087 B2 10/2007 Hill et al.
7,301,759 B2 11/2007 Hsiung
7,365,967 B2 4/2008 Zheng
7,374,312 B2 5/2008 Feng et al.
7,400,805 B2 7/2008 Abu-Ageel
7,401,992 B1 7/2008 Lin
7,415,676 B2 8/2008 Fujita
7,417,564 B2 8/2008 Tolonen et al.
7,417,626 B2 8/2008 Bhesania et al.
7,423,557 B2 9/2008 Kang
7,437,193 B2 10/2008 Parramon et al.
7,447,934 B2 11/2008 Dasari et al.
7,453,376 B2 11/2008 De
7,457,108 B2 11/2008 Ghosh
7,469,386 B2 12/2008 Bear et al.
7,486,165 B2 2/2009 Ligtenberg et al.
7,486,276 B2 2/2009 Yajima et al.
7,499,037 B2 3/2009 Lube
7,502,803 B2 3/2009 Culter et al.
7,542,052 B2 6/2009 Solomon et al.
7,558,594 B2 7/2009 Wilson
7,559,834 B1 7/2009 York
RE40,891 E 9/2009 Yasutake
7,583,500 B2 * 9/2009 Ligtenberg ..... G06F 1/1616 361/147
7,594,638 B2 9/2009 Chan et al.
7,620,244 B1 11/2009 Collier
7,622,907 B2 11/2009 Vranish
7,623,121 B2 11/2009 Dodge
7,626,358 B2 12/2009 Lam et al.
7,636,921 B2 12/2009 Louie
7,639,329 B2 12/2009 Takeda et al.
7,639,876 B2 12/2009 Clary et al.
7,656,392 B2 2/2010 Bolender
7,686,066 B2 3/2010 Hirao
7,722,358 B2 5/2010 Chatterjee et al.
7,722,792 B2 5/2010 Uezaki et al.
7,728,923 B2 6/2010 Kim et al.
7,729,493 B2 6/2010 Krieger et al.
7,731,147 B2 6/2010 Rha
7,733,326 B1 6/2010 Adiseshan
7,761,119 B2 7/2010 Patel
7,773,076 B2 8/2010 Pittel et al.
7,773,121 B1 8/2010 Huntsberger et al.
7,774,155 B2 8/2010 Sato et al.
7,777,972 B1 8/2010 Chen et al.
7,782,342 B2 8/2010 Koh
7,813,715 B2 10/2010 McKillop et al.
7,815,358 B2 10/2010 Inditsky
7,817,428 B2 10/2010 Greer, Jr. et al.
7,822,338 B2 10/2010 Wernersson
7,865,639 B2 1/2011 McCoy et al.
7,884,807 B2 2/2011 Hovden et al.
7,893,921 B2 2/2011 Sato
7,907,394 B2 3/2011 Richardson et al.
D636,397 S 4/2011 Green
7,928,964 B2 4/2011 Kolmykov-Zotov et al.
7,932,890 B2 4/2011 Onikiri et al.
7,936,501 B2 5/2011 Smith et al.
7,944,520 B2 5/2011 Ichioka et al.
7,945,717 B2 5/2011 Rivalsi
7,967,462 B2 6/2011 Ogiro et al.
7,970,246 B2 6/2011 Travis et al.
7,973,771 B2 7/2011 Geaghan
7,978,281 B2 7/2011 Vergith et al.
8,016,255 B2 9/2011 Lin
8,018,386 B2 9/2011 Qi et al.
8,018,579 B1 9/2011 Krah
8,026,904 B2 9/2011 Westerman
8,053,688 B2 11/2011 Conzola et al.
8,059,384 B2 11/2011 Park et al.
8,065,624 B2 11/2011 Morin et al.
8,069,356 B2 11/2011 Rathi et al.
8,077,160 B2 12/2011 Land et al.
8,090,885 B2 1/2012 Callaghan et al.
8,098,233 B2 1/2012 Hotelling et al.
8,115,499 B2 2/2012 Osoinach et al.
8,117,362 B2 2/2012 Rodriguez et al.
8,118,274 B2 2/2012 McClure et al.
8,120,166 B2 2/2012 Koizumi et al.
8,130,203 B2 3/2012 Westerman
8,149,219 B2 4/2012 Lii et al.
8,154,524 B2 4/2012 Wilson et al.
8,159,372 B2 4/2012 Sherman
8,162,282 B2 4/2012 Hu et al.
D659,139 S 5/2012 Gengler
8,169,421 B2 5/2012 Wright et al.
8,189,973 B2 5/2012 Travis et al.
8,229,509 B2 7/2012 Paek et al.
8,229,522 B2 7/2012 Kim et al.
8,231,099 B2 7/2012 Chen
8,243,432 B2 8/2012 Duan et al.
8,248,791 B2 8/2012 Wang et al.
8,255,708 B1 8/2012 Zhang
8,263,730 B2 9/2012 Shimizu
8,264,310 B2 9/2012 Lauder et al.

(56) References Cited

U.S. PATENT DOCUMENTS 8,267,368 B2 9/2012 Torii et al.
8,269,093 B2 9/2012 Naik et al.
8,269,731 B2 9/2012 Molne
8,274,784 B2 9/2012 Franz et al.
8,279,589 B2 10/2012 Kim ..... H04M 1/23 361/679.15
8,281,041 B2 10/2012 Butterfield
8,322,290 B1 12/2012 Mignano
8,346,206 B1 1/2013 Andrus et al.
8,363,036 B2 1/2013 Liang
8,373,664 B2 2/2013 Wright
8,384,566 B2 2/2013 Bocirnea
8,387,078 B2 2/2013 Memmott
8,387,938 B2 3/2013 Lin
8,389,078 B2 3/2013 Lin et al.
8,403,576 B2 3/2013 Merz
8,416,559 B2 4/2013 Agata et al.
8,424,160 B2 4/2013 Chen
8,446,359 B2 5/2013 Doczy et al.
8,498,100 B1 7/2013 Whitt, III et al.
8,514,568 B2 8/2013 Qiao et al.
8,520,371 B2 8/2013 Peng et al.
8,543,227 B1 9/2013 Perek et al.
8,548,608 B2 10/2013 Perek et al.
8,564,944 B2 10/2013 Whitt, III et al.
8,570,725 B2 10/2013 Whitt, III et al.
8,576,031 B2 11/2013 Lauder et al.
8,582,280 B2 11/2013 Ryu
8,587,701 B2 11/2013 Tatsuzawa
8,599,542 B1 12/2013 Healey et al.
8,610,015 B2 12/2013 Whitt et al.
8,614,666 B2 12/2013 Whitman et al.
8,646,999 B2 2/2014 Shaw et al.
8,654,030 B1 2/2014 Mercer
8,674,941 B2 3/2014 Casparian et al.
8,686,961 B2 4/2014 Yamano
8,699,215 B2 4/2014 Whitt, III et al.
8,719,603 B2 5/2014 Belesiu et al.
8,724,302 B2 5/2014 Whitt et al.
8,744,070 B2 6/2014 Zhang et al.
8,744,391 B2 6/2014 Tenbrook et al.
8,762,746 B1 6/2014 Lachwani et al.
8,767,388 B2 7/2014 Ahn et al.
8,780,541 B2 7/2014 Whitt et al.
8,791,382 B2 7/2014 Whitt, III et al.
8,797,765 B2 8/2014 Lin et al.
8,823,652 B2 9/2014 Linegar et al.
8,825,187 B1 9/2014 Hamrick et al.
8,830,668 B2 9/2014 Whit, III et al.
8,836,662 B2 9/2014 Liu
8,850,241 B2 9/2014 Oler et al.
8,854,799 B2 10/2014 Whitt, III et al.
8,873,227 B2 10/2014 Whitt et al.
8,891,232 B2 11/2014 Wang
8,896,993 B2 11/2014 Belesiu et al.
8,903,517 B2 12/2014 Perek et al.
8,908,858 B2 12/2014 Chiu et al.
8,934,221 B2 1/2015 Guo
8,935,774 B2 1/2015 Belesiu et al.
8,939,422 B2 1/2015 Liu et al.
8,947,864 B2 2/2015 Whitt, III et al.
8,952,892 B2 2/2015 Chai
8,964,376 B2 2/2015 Chen
8,988,876 B2 * 3/2015 Corbin ..... G06F 1/1656 361/679.58
8,991,473 B2 3/2015 Bornemann et al.
9,027,631 B2 5/2015 Bornemann et al.
9,047,207 B2 6/2015 Belesiu et al.
9,075,566 B2 7/2015 Whitt, III et al.
9,098,117 B2 8/2015 Lutz, III et al.
9,134,807 B2 9/2015 Shaw et al.
9,134,808 B2 9/2015 Siddiqui et al.
9,158,383 B2 10/2015 Shaw et al.
9,176,900 B2 11/2015 Whitt, III et al.
9,176,901 B2 11/2015 Whitt, III et al.
9,246,487 B2 1/2016 Casparian et al.
9,268,373 B2 2/2016 Whitt et al.
9,298,236 B2 3/2016 Oler et al.
9,304,549 B2 4/2016 Siddiqui
9,304,948 B2 4/2016 Whitman et al.
9,304,949 B2 4/2016 Whitman et al.
9,348,605 B2 5/2016 Drasnin
9,360,893 B2 6/2016 Bathiche et al.
2001/0023818 A1 9/2001 Masaru et al.
2001/0035859 A1 11/2001 Kiser
2002/0000977 A1 1/2002 Vranish
2002/0005108 A1 1/2002 Ludwig
2002/0044216 A1 4/2002 Cha
2002/0070883 A1 6/2002 Dosch
2002/0126445 A1 9/2002 Minaguchi et al.
2002/0126446 A1 9/2002 Miyako et al.
2002/0134828 A1 9/2002 Sandbach et al.
2002/0135457 A1 9/2002 Sandbach et al.
2002/0154099 A1 10/2002 Oh
2002/0163510 A1 11/2002 Williams et al.
2002/0188721 A1 12/2002 Lemel et al.
2003/0000821 A1 1/2003 Takahashi et al.
2003/0007648 A1 1/2003 Currell
2003/0011576 A1 1/2003 Sandbach et al.
2003/0016282 A1 1/2003 Koizumi
2003/0044215 A1 3/2003 Monney et al.
2003/0051983 A1 3/2003 Lahr
2003/0067450 A1 4/2003 Thursfield et al.
2003/0108720 A1 6/2003 Kashino
2003/0132916 A1 7/2003 Kramer
2003/0163611 A1 8/2003 Nagao
2003/0173195 A1 9/2003 Federspiel
2003/0197687 A1 10/2003 Shetter
2003/0198008 A1 10/2003 Leapman et al.
2003/0231243 A1 12/2003 Shibutani
2004/0005184 A1 1/2004 Kim et al.
2004/0046796 A1 3/2004 Fujita
2004/0048941 A1 3/2004 Raffel et al.
2004/0056843 A1 3/2004 Lin et al.
2004/0085716 A1 5/2004 Uke
2004/0095333 A1 5/2004 Morag et al.
2004/0100457 A1 5/2004 Mandle
2004/0113956 A1 6/2004 Bellwood et al.
2004/0156168 A1 8/2004 LeVasseur et al.
2004/0160734 A1 8/2004 Yim
2004/0169641 A1 9/2004 Bean et al.
2004/0174670 A1 9/2004 Huang et al.
2004/0174709 A1 9/2004 Buelow, II et al.
2004/0190239 A1 9/2004 Weng et al.
2004/0212598 A1 10/2004 Kraus et al.
2004/0212601 A1 10/2004 Cake et al.
2004/0258924 A1 12/2004 Berger et al.
2004/0268000 A1 12/2004 Barker et al.
2005/0030728 A1 2/2005 Kawashima et al.
2005/0047773 A1 3/2005 Satake et al.
2005/0052831 A1 3/2005 Chen
2005/0055498 A1 3/2005 Beckert et al.
2005/0057515 A1 3/2005 Bathiche
2005/0057521 A1 3/2005 Aull et al.
2005/0059489 A1 3/2005 Kim
2005/0062715 A1 3/2005 Tsuji et al.
2005/0064765 A1 3/2005 Simpson et al.
2005/0099400 A1 5/2005 Lee
2005/0134717 A1 6/2005 Misawa
2005/0146512 A1 7/2005 Hill et al.
2005/0190159 A1 9/2005 Skarine
2005/0206737 A1 9/2005 Gim et al.
2005/0236848 A1 10/2005 Kim
2005/0240949 A1 10/2005 Liu et al.
2005/0264653 A1 12/2005 Starkweather et al.
2005/0264988 A1 12/2005 Nicolosi
2005/0283731 A1 12/2005 Saint-Hilaire et al.
2005/0285703 A1 12/2005 Wheeler et al.
2006/0002101 A1 1/2006 Wheatley et al.
2006/0007645 A1 1/2006 Chen et al.
2006/0049920 A1 3/2006 Sadler et al.
2006/0049993 A1 3/2006 Lin et al.
2006/0061555 A1 3/2006 Mullen
2006/0082973 A1 4/2006 Egbert et al.

(56) References Cited

U.S. PATENT DOCUMENTS

2006/0085658 A1 4/2006 Allen et al.
2006/0092139 A1 5/2006 Sharma
2006/0096392 A1 5/2006 Inkster et al.
2006/0102914 A1 5/2006 Smits et al.
2006/0103633 A1 5/2006 Gioeli
2006/0125799 A1 6/2006 Hillis et al.
2006/0132423 A1 6/2006 Travis
2006/0152499 A1 7/2006 Roberts
2006/0154725 A1 7/2006 Glaser et al.
2006/0155391 A1 7/2006 Pistemaa et al.
2006/0156415 A1 7/2006 Rubinstein et al.
2006/0174143 A1 8/2006 Sawyers et al.
2006/0176377 A1 8/2006 Miyasaka
2006/0181514 A1 8/2006 Newman
2006/0181521 A1 8/2006 Perreault et al.
2006/0187216 A1 8/2006 Trent, Jr. et al.
2006/0192763 A1 8/2006 Ziemkowski
2006/0195522 A1 8/2006 Miyazaki
2006/0197755 A1 9/2006 Bawany
2006/0227393 A1 10/2006 Herloski
2006/0238510 A1 10/2006 Panotopoulos et al.
2006/0239006 A1 10/2006 Chaves et al.
2006/0254042 A1 11/2006 Chou et al.
2006/0265617 A1 11/2006 Priborsky
2006/0267931 A1 11/2006 Vainio et al.
2006/0272429 A1 12/2006 Ganapathi et al.
2007/0003267 A1 1/2007 Shibutani
2007/0047221 A1 3/2007 Park
2007/0047260 A1 3/2007 Lee et al.
2007/0051766 A1 3/2007 Spencer
2007/0051792 A1 3/2007 Wheeler et al.
2007/0056385 A1 3/2007 Lorenz
2007/0062089 A1 3/2007 Homer et al.
2007/0069153 A1 3/2007 Pai-Paranjape et al.
2007/0072474 A1 3/2007 Beasley et al.
2007/0116929 A1 5/2007 Fujimori et al.
2007/0117600 A1 5/2007 Robertson et al.
2007/0121956 A1 5/2007 Bai et al.
2007/0145945 A1 6/2007 McGinley et al.
2007/0172229 A1 7/2007 Wernersson
2007/0176902 A1 8/2007 Newman et al.
2007/0178891 A1 8/2007 Louch et al.
2007/0182663 A1 8/2007 Biech
2007/0182722 A1 8/2007 Hotelling et al.
2007/0185590 A1 8/2007 Reindel et al.
2007/0188478 A1 8/2007 Silverstein et al.
2007/0200830 A1 8/2007 Yamamoto
2007/0220708 A1 9/2007 Lewis
2007/0230227 A1 10/2007 Palmer
2007/0234420 A1 10/2007 Novotney et al.
2007/0236408 A1 10/2007 Yamaguchi et al.
2007/0236475 A1 10/2007 Wherry
2007/0236873 A1 10/2007 Yukawa et al.
2007/0247338 A1 10/2007 Marchetto
2007/0247432 A1 10/2007 Oakley
2007/0252674 A1 11/2007 Nelson et al.
2007/0257821 A1 11/2007 Son et al.
2007/0260892 A1 11/2007 Paul et al.
2007/0268273 A1 11/2007 Westerman et al.
2007/0274094 A1 11/2007 Schultz et al.
2007/0274095 A1 11/2007 Destain
2007/0283179 A1 12/2007 Burnett et al.
2007/0296709 A1 12/2007 Guanghai
2007/0297125 A1 12/2007 Maatta
2007/0297625 A1 12/2007 Hjort et al.
2008/0005423 A1 1/2008 Jacobs et al.
2008/0013809 A1 1/2008 Zhu et al.
2008/0018611 A1 1/2008 Serban et al.
2008/0030937 A1 2/2008 Russo et al.
2008/0042978 A1 2/2008 Perez-Noguera
2008/0053222 A1 3/2008 Ehrensvard et al.
2008/0059888 A1 3/2008 Dunko
2008/0074398 A1 3/2008 Wright
2008/0080166 A1 4/2008 Duong et al.
2008/0104437 A1 5/2008 Lee
2008/0129520 A1 6/2008 Lee
2008/0151478 A1 6/2008 Chern, Jr.
2008/0158185 A1 7/2008 Westerman
2008/0167832 A1 7/2008 Soss
2008/0174570 A1 7/2008 Jobs et al.
2008/0180411 A1 7/2008 Solomon et al.
2008/0186660 A1 8/2008 Yang
2008/0219025 A1 9/2008 Spitzer et al.
2008/0228969 A1 9/2008 Cheah et al.
2008/0232061 A1 9/2008 Wang et al.
2008/0233326 A1 9/2008 Hegemier et al.
2008/0238884 A1 10/2008 Harish
2008/0253822 A1 10/2008 Matias
2008/0273297 A1 11/2008 Kumar
2008/0297878 A1 12/2008 Brown et al.
2008/0307242 A1 12/2008 Qu
2008/0309636 A1 12/2008 Feng et al.
2008/0316002 A1 12/2008 Brunet et al.
2008/0316183 A1 12/2008 Westerman et al.
2008/0320190 A1 12/2008 Lydon et al.
2009/0002218 A1 1/2009 Rigazio et al.
2009/0007001 A1 1/2009 Morin et al.
2009/0009476 A1 1/2009 Daley, III
2009/0020343 A1 1/2009 Rothkopf et al.
2009/0046416 A1 2/2009 Daley, III
2009/0049979 A1 2/2009 Naik et al.
2009/0065267 A1 3/2009 Sato
2009/0066653 A1 3/2009 Wang
2009/0067156 A1 3/2009 Bonnett et al.
2009/0073060 A1 3/2009 Shimasaki et al.
2009/0073957 A1 3/2009 Newland et al.
2009/0079639 A1 3/2009 Hotta et al.
2009/0083562 A1 3/2009 Park et al.
2009/0089600 A1 4/2009 Nousiainen
2009/0102794 A1 4/2009 Lapstun et al.
2009/0102805 A1 4/2009 Meijer et al.
2009/0127005 A1 5/2009 Zachut et al.
2009/0131134 A1 5/2009 Baerlocher et al.
2009/0135142 A1 5/2009 Fu et al.
2009/0140985 A1 6/2009 Liu
2009/0158221 A1 6/2009 Nielsen et al.
2009/0163147 A1 6/2009 Steigerwald et al.
2009/0167728 A1 7/2009 Geaghan et al.
2009/0174687 A1 7/2009 Ciesla et al.
2009/0174759 A1 7/2009 Yeh et al.
2009/0182901 A1 7/2009 Callaghan et al.
2009/0189873 A1 7/2009 Peterson et al.
2009/0195497 A1 8/2009 Fitzgerald et al.
2009/0195518 A1 8/2009 Mattice et al.
2009/0201254 A1 8/2009 Rais
2009/0207144 A1 8/2009 Bridger
2009/0219250 A1 9/2009 Ure
2009/0231275 A1 9/2009 Odgers
2009/0239586 A1 9/2009 Boeve et al.
2009/0244009 A1 10/2009 Staats et al.
2009/0244832 A1 10/2009 Behar et al.
2009/0244872 A1 10/2009 Yan
2009/0251008 A1 10/2009 Sugaya
2009/0259865 A1 10/2009 Sheynblat et al.
2009/0262492 A1 10/2009 Whitchurch et al.
2009/0265670 A1 10/2009 Kim et al.
2009/0269943 A1* 10/2009 Palli ..... H01R 13/6205 439/39
2009/0285491 A1 11/2009 Ravenscroft et al.
2009/0296331 A1 12/2009 Choy
2009/0303137 A1 12/2009 Kusaka et al.
2009/0303204 A1 12/2009 Nasiri et al.
2009/0315830 A1 12/2009 Westerman
2009/0320244 A1 12/2009 Lin
2009/0321490 A1 12/2009 Groene et al.
2010/0001963 A1 1/2010 Doray et al.
2010/0013319 A1 1/2010 Kamiyama et al.
2010/0021022 A1 1/2010 Pittel et al.
2010/0023869 A1 1/2010 Saint-Hilaire et al.
2010/0026656 A1 2/2010 Hotelling et al.
2010/0038821 A1 2/2010 Jenkins et al.
2010/0039081 A1 2/2010 Sip
2010/0039764 A1 2/2010 Locker et al.
2010/0045540 A1 2/2010 Lai et al.

(56) References Cited

U.S. PATENT DOCUMENTS

2010/0045609 A1 2/2010 Do et al.
2010/0045633 A1 2/2010 Gettemy
2010/0051356 A1 3/2010 Stern et al.
2010/0051432 A1 3/2010 Lin et al.
2010/0052880 A1 3/2010 Laitinen et al.
2010/0053534 A1 3/2010 Hsieh et al.
2010/0054435 A1 3/2010 Louch et al.
2010/0056130 A1 3/2010 Louch et al.
2010/0072334 A1 3/2010 Le Gette et al.
2010/0073329 A1 3/2010 Raman et al.
2010/0075517 A1 3/2010 Ni et al.
2010/0077237 A1 3/2010 Sawyers
2010/0079379 A1 4/2010 Demuynck et al.
2010/0081377 A1 4/2010 Chatterjee et al.
2010/0083108 A1 4/2010 Rider et al.
2010/0085321 A1 4/2010 Pundsack
2010/0102182 A1 4/2010 Lin
2010/0103112 A1 4/2010 Yoo et al.
2010/0103131 A1 4/2010 Segal et al.
2010/0105443 A1 4/2010 Vaisanen
2010/0106983 A1 4/2010 Kasprzak et al.
2010/0115309 A1 5/2010 Carvalho et al.
2010/0117993 A1 5/2010 Kent
2010/0123686 A1 5/2010 Klinghult et al.
2010/0128427 A1 5/2010 Iso
2010/0133398 A1 6/2010 Chiu et al.
2010/0142130 A1 6/2010 Wang et al.
2010/0148995 A1 6/2010 Elias
2010/0148999 A1 6/2010 Casparian et al.
2010/0149104 A1 6/2010 Sim et al.
2010/0149111 A1 6/2010 Olien
2010/0149134 A1 6/2010 Westerman et al.
2010/0149377 A1 6/2010 Shintani et al.
2010/0154171 A1 6/2010 Lombardi et al.
2010/0156798 A1 6/2010 Archer
2010/0156913 A1 6/2010 Ortega et al. ..... G06F 3/1423 345/520
2010/0161522 A1 6/2010 Tirpak et al.
2010/0162109 A1 6/2010 Chatterjee et al.
2010/0164857 A1 7/2010 Liu et al.
2010/0164897 A1 7/2010 Morin et al.
2010/0171891 A1 7/2010 Kaji et al.
2010/0174421 A1 7/2010 Tsai et al.
2010/0180063 A1 7/2010 Ananny et al.
2010/0188299 A1 7/2010 Rinehart et al.
2010/0188338 A1 7/2010 Longe
2010/0205472 A1 8/2010 Tupman et al.
2010/0206614 A1 8/2010 Park et al.
2010/0206644 A1 8/2010 Yeh
2010/0214214 A1 8/2010 Corson et al.
2010/0214257 A1 8/2010 Wussler et al.
2010/0222110 A1 9/2010 Kim et al.
2010/0231498 A1 9/2010 Large et al.
2010/0231510 A1 9/2010 Sampsell et al.
2010/0231556 A1 9/2010 Mines et al.
2010/0235546 A1 9/2010 Terlizzi et al.
2010/0238075 A1 9/2010 Pourseyed
2010/0238119 A1 9/2010 Dubrovsky et al.
2010/0238138 A1 9/2010 Goertz et al.
2010/0238620 A1 9/2010 Fish
2010/0245221 A1 9/2010 Khan
2010/0250988 A1 9/2010 Okuda et al.
2010/0259482 A1 10/2010 Ball
2010/0259876 A1 10/2010 Kim
2010/0265182 A1 10/2010 Ball et al.
2010/0271771 A1 10/2010 Wu et al.
2010/0274932 A1 10/2010 Kose
2010/0279768 A1 11/2010 Huang et al.
2010/0289457 A1 11/2010 Onnerud et al.
2010/0291331 A1 11/2010 Schaefer
2010/0295812 A1 11/2010 Burns et al.
2010/0302378 A1 12/2010 Marks et al.
2010/0304793 A1 12/2010 Kim
2010/0306538 A1 12/2010 Thomas et al.
2010/0308778 A1 12/2010 Yamazaki et al.
2010/0308844 A1 12/2010 Day et al.
2010/0309617 A1 12/2010 Wang et al.
2010/0313680 A1 12/2010 Joung et al.
2010/0315348 A1 12/2010 Jellicoe et al.
2010/0315373 A1 12/2010 Steinhauser et al.
2010/0321301 A1 12/2010 Casparian et al.
2010/0321339 A1 12/2010 Kimmel
2010/0321877 A1 12/2010 Moser
2010/0324457 A1 12/2010 Bean et al.
2010/0325155 A1 12/2010 Skinner et al.
2010/0328203 A1 12/2010 Hsu
2010/0331059 A1 12/2010 Apgar et al.
2011/0007008 A1 1/2011 Algreatly
2011/0012873 A1 1/2011 Prest et al.
2011/0019123 A1 1/2011 Prest et al.
2011/0031287 A1 2/2011 Le Gette et al.
2011/0032127 A1 2/2011 Roush
2011/0036965 A1 2/2011 Zhang et al.
2011/0037721 A1 2/2011 Cranfill et al.
2011/0043990 A1 2/2011 Mickey et al.
2011/0050576 A1 3/2011 Forutanpour et al.
2011/0050587 A1 3/2011 Natanzon et al.
2011/0050626 A1 3/2011 Porter et al.
2011/0055407 A1 3/2011 Lydon et al.
2011/0057724 A1 3/2011 Pabon
2011/0057899 A1 3/2011 Sleeman et al.
2011/0060926 A1 3/2011 Brooks et al.
2011/0069148 A1 3/2011 Jones et al.
2011/0074688 A1 3/2011 Hull et al.
2011/0095994 A1 4/2011 Birnbaum
2011/0096513 A1 4/2011 Kim ..... H04M 1/0254 361/747
2011/0102326 A1 5/2011 Casparian et al.
2011/0102356 A1 5/2011 Kemppinen et al.
2011/0102752 A1 5/2011 Chen et al.
2011/0107958 A1 5/2011 Pance et al.
2011/0113368 A1 5/2011 Carvajal et al.
2011/0115738 A1 5/2011 Suzuki et al.
2011/0115747 A1 5/2011 Powell et al.
2011/0117970 A1 5/2011 Choi
2011/0134032 A1 6/2011 Chiu et al.
2011/0134043 A1 6/2011 Chen
2011/0134112 A1 6/2011 Koh et al.
2011/0157046 A1 6/2011 Lee et al.
2011/0157087 A1 6/2011 Kanehira et al.
2011/0163955 A1 7/2011 Nasiri et al.
2011/0164370 A1 7/2011 McClure et al.
2011/0167181 A1 7/2011 Minoo et al.
2011/0167287 A1 7/2011 Walsh et al.
2011/0167391 A1 7/2011 Momeyer et al.
2011/0167992 A1 7/2011 Eventoff et al.
2011/0169762 A1 7/2011 Weiss
2011/0170289 A1 7/2011 Allen et al.
2011/0176035 A1 7/2011 Poulsen
2011/0179864 A1 7/2011 Raasch et al.
2011/0183120 A1 7/2011 Sharygin et al.
2011/0184646 A1 7/2011 Wong et al.
2011/0184824 A1 7/2011 George et al.
2011/0188199 A1 8/2011 Pan
2011/0193787 A1 8/2011 Morishige et al.
2011/0193938 A1 8/2011 Oderwald et al.
2011/0199389 A1 8/2011 Lu et al.
2011/0202878 A1 8/2011 Park et al.
2011/0205372 A1 8/2011 Miramontes
2011/0216266 A1 9/2011 Travis
2011/0221678 A1 9/2011 Davydov
2011/0227913 A1 9/2011 Hyndman
2011/0228457 A1 9/2011 Moon et al.
2011/0231682 A1 9/2011 Kakish et al.
2011/0234494 A1 9/2011 Peterson et al.
2011/0234502 A1 9/2011 Yun et al.
2011/0242138 A1 10/2011 Tribble
2011/0248152 A1 10/2011 Svajda et al.
2011/0248920 A1 10/2011 Larsen
2011/0248941 A1 10/2011 Abdo et al.
2011/0259788 A1 10/2011 Zeliff et al.
2011/0261001 A1 10/2011 Liu
2011/0261083 A1 10/2011 Wilson
2011/0265287 A1 11/2011 Li et al.

(56) References Cited

U.S. PATENT DOCUMENTS

2011/0266672 A1 11/2011 Sylvester
2011/0267272 A1 11/2011 Meyer et al.
2011/0267300 A1 11/2011 Serban et al.
2011/0273475 A1 11/2011 Herz et al.
2011/0284420 A1 11/2011 Sajid
2011/0290686 A1 12/2011 Huang
2011/0295697 A1 12/2011 Boston et al.
2011/0297566 A1 12/2011 Gallagher et al.
2011/0298919 A1 12/2011 Maglaque
2011/0302518 A1 12/2011 Zhang
2011/0304577 A1 12/2011 Brown
2011/0304962 A1 12/2011 Su ..... G06F 1/1628 361/679.01
2011/0305875 A1 12/2011 Sanford et al.
2011/0310038 A1 12/2011 Park et al.
2011/0316807 A1 12/2011 Corrion
2011/0317399 A1 12/2011 Hsu
2011/0320204 A1 12/2011 Locker et al.
2012/0002820 A1 1/2012 Leichter
2012/0007821 A1 1/2012 Zaliva
2012/0011462 A1 1/2012 Westerman et al.
2012/0013490 A1 1/2012 Pance
2012/0013519 A1 1/2012 Hakansson et al.
2012/0020490 A1 1/2012 Leichter
2012/0023401 A1 1/2012 Arscott et al.
2012/0023459 A1 1/2012 Westerman
2012/0024682 A1 2/2012 Huang et al.
2012/0026048 A1 2/2012 Vazquez et al.
2012/0026096 A1 2/2012 Ku
2012/0032887 A1 2/2012 Chiu et al.
2012/0032891 A1 2/2012 Parivar
2012/0032901 A1 2/2012 Kwon
2012/0038495 A1 2/2012 Ishikawa
2012/0044179 A1 2/2012 Hudson
2012/0047368 A1 2/2012 Chinn et al.
2012/0050975 A1 3/2012 Garelli et al.
2012/0062564 A1 3/2012 Miyashita
2012/0068919 A1 3/2012 Lauder et al.
2012/0068933 A1 3/2012 Larsen
2012/0069540 A1 3/2012 Lauder et al.
2012/0072167 A1 3/2012 Cretella, Jr. et al.
2012/0075249 A1 3/2012 Hoch
2012/0077384 A1 3/2012 Bar-Niv et al.
2012/0081316 A1 4/2012 Sirpal et al.
2012/0084548 A1 4/2012 Cheng et al.
2012/0087078 A1 4/2012 Medica et al.
2012/0092279 A1 4/2012 Martin
2012/0094257 A1 4/2012 Pillischer et al.
2012/0099263 A1 4/2012 Lin
2012/0099749 A1 4/2012 Rubin et al.
2012/0103778 A1 5/2012 Obata et al.
2012/0106082 A1 5/2012 Wu et al.
2012/0113137 A1 5/2012 Nomoto
2012/0113579 A1 5/2012 Agata et al.
2012/0115553 A1 5/2012 Mahe et al.
2012/0117409 A1 5/2012 Lee et al.
2012/0127118 A1 5/2012 Nolting et al.
2012/0127126 A1 5/2012 Mattice et al.
2012/0133561 A1 5/2012 Konanur et al.
2012/0139727 A1 6/2012 Houvener et al.
2012/0140396 A1 6/2012 Zeliff et al.
2012/0145525 A1 6/2012 Ishikawa
2012/0155015 A1 6/2012 Govindasamy et al.
2012/0161406 A1 6/2012 Mersky
2012/0162693 A1 6/2012 Ito
2012/0175487 A1 7/2012 Goto
2012/0182242 A1 7/2012 Lindahl et al.
2012/0182249 A1 7/2012 Endo et al.
2012/0182743 A1 7/2012 Chou
2012/0194393 A1 8/2012 Uttermann et al.
2012/0194448 A1 8/2012 Rothkopf
2012/0195063 A1 8/2012 Kim et al.
2012/0200802 A1 8/2012 Large
2012/0206937 A1 8/2012 Travis et al.
2012/0212438 A1 8/2012 Vaisanen
2012/0218194 A1 8/2012 Silverman
2012/0223866 A1 9/2012 Ayala et al.
2012/0224073 A1 9/2012 Miyahara
2012/0227259 A1 9/2012 Badaye et al.
2012/0229634 A1 9/2012 Laett et al.
2012/0235635 A1 9/2012 Sato
2012/0235921 A1 9/2012 Laubach
2012/0242584 A1 9/2012 Tuli
2012/0243165 A1 9/2012 Chang et al.
2012/0243204 A1 9/2012 Robinson
2012/0246377 A1 9/2012 Bhesania
2012/0249443 A1 10/2012 Anderson et al.
2012/0250873 A1 10/2012 Bakalos et al.
2012/0256829 A1 10/2012 Dodge
2012/0256959 A1 10/2012 Ye et al.
2012/0260177 A1 10/2012 Sehrer
2012/0268912 A1 10/2012 Minami et al.
2012/0274811 A1 11/2012 Bakin
2012/0287562 A1 11/2012 Wu et al.
2012/0298491 A1 11/2012 Ozias et al.
2012/0299872 A1 11/2012 Nishikawa et al.
2012/0300275 A1 11/2012 Vilardell et al.
2012/0312955 A1 12/2012 Randolph
2012/0326003 A1 12/2012 Solow et al.
2012/0328349 A1 12/2012 Isaac et al.
2013/0009413 A1 1/2013 Chiu et al.
2013/0015311 A1 1/2013 Kim
2013/0016468 A1 1/2013 Oh
2013/0021289 A1 1/2013 Chen et al.
2013/0027867 A1 1/2013 Lauder et al.
2013/0044059 A1 2/2013 Fu
2013/0044074 A1 2/2013 Park et al.
2013/0046397 A1 2/2013 Fadell et al.
2013/0050922 A1 2/2013 Lee et al.
2013/0063873 A1 3/2013 Wodrich et al.
2013/0067126 A1 3/2013 Casparian et al.
2013/0069916 A1 3/2013 Estève
2013/0073877 A1 3/2013 Radke
2013/0076617 A1 3/2013 Csaszar et al.
2013/0076635 A1 3/2013 Lin
2013/0082824 A1 4/2013 Colley
2013/0082950 A1 4/2013 Lim et al.
2013/0088431 A1 4/2013 Ballagas et al.
2013/0093388 A1 4/2013 Partovi
2013/0100082 A1 4/2013 Bakin et al.
2013/0106723 A1 5/2013 Bakken et al.
2013/0106766 A1 5/2013 Yilmaz et al.
2013/0107144 A1 5/2013 Marhefka et al.
2013/0107572 A1 5/2013 Holman et al.
2013/0118878 A1 5/2013 Purcocks
2013/0135214 A1 5/2013 Li et al.
2013/0154959 A1 6/2013 Lindsay et al.
2013/0162554 A1 6/2013 Lauder et al.
2013/0172906 A1 7/2013 Olson et al.
2013/0191741 A1 7/2013 Dickinson et al.
2013/0207937 A1 8/2013 Lutian et al.
2013/0212483 A1 8/2013 Brakensiek et al.
2013/0217451 A1 8/2013 Komiyama et al.
2013/0222272 A1 8/2013 Martin, Jr.
2013/0222274 A1 8/2013 Mori et al.
2013/0222323 A1 8/2013 McKenzie
2013/0227836 A1 9/2013 Whitt, III
2013/0228023 A1 9/2013 Drasnin
2013/0228433 A1 9/2013 Shaw
2013/0228434 A1 9/2013 Whitt, III
2013/0228435 A1 9/2013 Whitt, III
2013/0228439 A1 9/2013 Whitt, III
2013/0229100 A1 9/2013 Siddiqui
2013/0229335 A1 9/2013 Whitman
2013/0229347 A1 9/2013 Lutz, III
2013/0229350 A1 9/2013 Shaw
2013/0229351 A1 9/2013 Whitt, III
2013/0229354 A1 9/2013 Whitt, III
2013/0229356 A1 9/2013 Marwah
2013/0229363 A1 9/2013 Whitman
2013/0229366 A1 9/2013 Dighde
2013/0229380 A1 9/2013 Lutz, III
2013/0229386 A1 9/2013 Bathiche
2013/0229534 A1 9/2013 Panay

(56) References Cited

U.S. PATENT DOCUMENTS

| | | | |
|---|---|---|---|
| 2013/0229568 | A1 | 9/2013 | Belesiu |
| 2013/0229570 | A1 | 9/2013 | Beck et al. |
| 2013/0229756 | A1 | 9/2013 | Whitt, III |
| 2013/0229757 | A1 | 9/2013 | Whitt, III |
| 2013/0229758 | A1 | 9/2013 | Belesiu |
| 2013/0229759 | A1 | 9/2013 | Whitt, III |
| 2013/0229760 | A1 | 9/2013 | Whitt, III |
| 2013/0229761 | A1 | 9/2013 | Shaw |
| 2013/0229762 | A1 | 9/2013 | Whitt, III |
| 2013/0229773 | A1 | 9/2013 | Siddiqui |
| 2013/0230346 | A1 | 9/2013 | Shaw |
| 2013/0231755 | A1 | 9/2013 | Perek |
| 2013/0232280 | A1 | 9/2013 | Perek |
| 2013/0232348 | A1 | 9/2013 | Oler |
| 2013/0232349 | A1 | 9/2013 | Oler |
| 2013/0232350 | A1 | 9/2013 | Belesiu et al. |
| 2013/0232353 | A1 | 9/2013 | Belesiu |
| 2013/0232571 | A1 | 9/2013 | Belesiu |
| 2013/0241860 | A1 | 9/2013 | Ciesla et al. |
| 2013/0262886 | A1 | 10/2013 | Nishimura |
| 2013/0278552 | A1 | 10/2013 | Kamin-Lyndgaard |
| 2013/0300590 | A1 | 11/2013 | Dietz |
| 2013/0300647 | A1 | 11/2013 | Drasnin |
| 2013/0301199 | A1 | 11/2013 | Whitt |
| 2013/0301206 | A1 | 11/2013 | Whitt |
| 2013/0304941 | A1 | 11/2013 | Drasnin |
| 2013/0304944 | A1 | 11/2013 | Young |
| 2013/0321992 | A1 | 12/2013 | Liu et al. |
| 2013/0322000 | A1 | 12/2013 | Whitt |
| 2013/0322001 | A1 | 12/2013 | Whitt |
| 2013/0329360 | A1 | 12/2013 | Aldana |
| 2013/0332628 | A1 | 12/2013 | Panay |
| 2013/0335330 | A1 | 12/2013 | Lane |
| 2013/0335902 | A1 | 12/2013 | Campbell |
| 2013/0335903 | A1 | 12/2013 | Raken |
| 2013/0339757 | A1 | 12/2013 | Reddy |
| 2013/0342464 | A1 | 12/2013 | Bathiche et al. |
| 2013/0342465 | A1 | 12/2013 | Bathiche |
| 2013/0342976 | A1 | 12/2013 | Chung |
| 2013/0346636 | A1 | 12/2013 | Bathiche |
| 2014/0012401 | A1 | 1/2014 | Perek |
| 2014/0028635 | A1 | 1/2014 | Krah |
| 2014/0029183 | A1 | 1/2014 | Ashcraft et al. |
| 2014/0043275 | A1 | 2/2014 | Whitman |
| 2014/0048399 | A1 | 2/2014 | Whitt, III |
| 2014/0049894 | A1 | 2/2014 | Rihn |
| 2014/0085814 | A1 | 3/2014 | Kielland |
| 2014/0117928 | A1 | 5/2014 | Liao |
| 2014/0118241 | A1 | 5/2014 | Chai |
| 2014/0119802 | A1 | 5/2014 | Shaw |
| 2014/0131000 | A1 | 5/2014 | Bornemann et al. |
| 2014/0135060 | A1 | 5/2014 | Mercer |
| 2014/0139989 | A1 | 5/2014 | Mori et al. |
| 2014/0148938 | A1 | 5/2014 | Zhang |
| 2014/0154523 | A1 | 6/2014 | Bornemann et al. |
| 2014/0159867 | A1* | 6/2014 | Sartee ..... G08B 5/36 340/6.1 |
| 2014/0166227 | A1 | 6/2014 | Bornemann et al. |
| 2014/0167585 | A1 | 6/2014 | Kuan et al. |
| 2014/0185215 | A1 | 7/2014 | Whitt |
| 2014/0185220 | A1 | 7/2014 | Whitt |
| 2014/0204514 | A1 | 7/2014 | Whitt |
| 2014/0204515 | A1 | 7/2014 | Whitt |
| 2014/0233237 | A1 | 8/2014 | Lutian |
| 2014/0247546 | A1 | 9/2014 | Whitt |
| 2014/0248506 | A1 | 9/2014 | McCormack |
| 2014/0291134 | A1 | 10/2014 | Whitt |
| 2014/0293534 | A1 | 10/2014 | Siddiqui |
| 2014/0313665 | A1 | 10/2014 | Delpier et al. ..... G06F 1/1654 361/679.55 |
| 2014/0362506 | A1 | 12/2014 | Whitt, III et al. |
| 2014/0372914 | A1 | 12/2014 | Byrd et al. |
| 2014/0379942 | A1 | 12/2014 | Perek et al. |
| 2015/0005953 | A1 | 1/2015 | Fadell et al. |
| 2015/0036274 | A1 | 2/2015 | Belesiu et al. |
| 2015/0234478 | A1 | 8/2015 | Belesiu et al. |
| 2015/0261262 | A1 | 9/2015 | Whitt, III et al. |
| 2015/0311014 | A1 | 10/2015 | Shaw et al. |
| 2015/0378392 | A1 | 12/2015 | Siddiqui et al. |
| 2016/0124467 | A1 | 5/2016 | Whitt et al. |

FOREIGN PATENT DOCUMENTS

| | | | |
|---|---|---|---|
| CN | 1787605 | | 6/2006 |
| CN | 101198925 | | 6/2008 |
| CN | 101335147 | | 12/2008 |
| CN | 101366001 | | 2/2009 |
| CN | 101410781 | | 4/2009 |
| CN | 101452334 | | 6/2009 |
| CN | 101464750 | | 6/2009 |
| CN | 101490642 | | 7/2009 |
| CN | 101500388 | | 8/2009 |
| CN | 101908428 | | 12/2010 |
| CN | 102096494 | | 6/2011 |
| CN | 201853163 | | 6/2011 |
| CN | 102124532 | | 7/2011 |
| CN | 102138113 | | 7/2011 |
| CN | 102214040 | | 10/2011 |
| CN | 202441167 | | 9/2012 |
| CN | 103455149 | | 12/2013 |
| CN | 203606723 | | 5/2014 |
| EP | 0271956 | | 6/1988 |
| EP | 645726 | | 3/1995 |
| EP | 1003188 | | 5/2000 |
| EP | 1223722 | | 7/2002 |
| EP | 1480029 | | 11/2004 |
| EP | 1591891 | | 11/2005 |
| EP | 2006869 | | 12/2008 |
| EP | 2009660 | | 12/2008 |
| EP | 2026178 | | 2/2009 |
| EP | 2353978 | | 8/2011 |
| EP | 2378607 | | 10/2011 |
| EP | 2400365 | | 12/2011 |
| EP | 2423787 | | 2/2012 |
| GB | 1100331 | | 1/1968 |
| GB | 2123213 | | 1/1984 |
| GB | 2178570 | | 2/1987 |
| GB | 2305780 | | 4/1997 |
| GB | 2402460 | | 12/2004 |
| GB | 2482932 | | 2/2012 |
| JP | 52107722 | | 9/1977 |
| JP | 56108127 | | 8/1981 |
| JP | 56159134 | | 12/1981 |
| JP | 6014315 | | 1/1985 |
| JP | 08273471 | | 10/1996 |
| JP | 10326124 | | 12/1998 |
| JP | 1173239 | | 3/1999 |
| JP | 11338575 | | 12/1999 |
| JP | 11345041 | | 12/1999 |
| JP | 2000010654 | | 1/2000 |
| JP | 2001142564 | | 5/2001 |
| JP | 2001243707 | A | 9/2001 |
| JP | 2002170458 | | 6/2002 |
| JP | 2004038950 | | 2/2004 |
| JP | 2005117161 | | 4/2005 |
| JP | 2006163459 | | 6/2006 |
| JP | 2006294361 | | 10/2006 |
| JP | 2010244514 | | 10/2010 |
| JP | 2011027815 | A | 2/2011 |
| JP | 2003077368 | | 3/2014 |
| KR | 20010107055 | | 12/2001 |
| KR | 20040003709 | A | 1/2004 |
| KR | 20050014299 | | 2/2005 |
| KR | 20060003093 | | 1/2006 |
| KR | 20060055307 | A | 5/2006 |
| KR | 20080006404 | | 1/2008 |
| KR | 20090029411 | | 3/2009 |
| KR | 20100022059 | | 2/2010 |
| KR | 20100067366 | | 6/2010 |
| KR | 20100115675 | | 10/2010 |
| KR | 1020110087178 | | 8/2011 |
| KR | 20110109791 | | 10/2011 |
| KR | 20110120002 | | 11/2011 |
| KR | 20110122333 | | 11/2011 |

(56) References Cited

FOREIGN PATENT DOCUMENTS

| | | | |
|---|---|---|---|
| KR | 20110138943 | A | 12/2011 |
| KR | 101113530 | | 2/2012 |
| KR | 20120015749 | A | 2/2012 |
| NL | 1038411 | | 5/2012 |
| WO | WO-9108915 | | 6/1991 |
| WO | WO-9919995 | | 4/1999 |
| WO | WO-03106134 | | 12/2003 |
| WO | WO-2005027696 | | 3/2005 |
| WO | WO-2006044818 | | 4/2006 |
| WO | WO-2007112172 | | 10/2007 |
| WO | WO-2008055039 | | 5/2008 |
| WO | 2009020264 | A1 | 2/2009 |
| WO | WO-2009034484 | | 3/2009 |
| WO | WO-2010011983 | | 1/2010 |
| WO | WO-2010074116 | | 7/2010 |
| WO | WO-2010105272 | | 9/2010 |
| WO | WO-2011049609 | | 4/2011 |
| WO | WO-2012036717 | | 3/2012 |
| WO | WO-2013012699 | | 1/2013 |
| WO | WO-2013033067 | | 3/2013 |
| WO | WO-2014209818 | | 12/2014 |

OTHER PUBLICATIONS

"Non Final Office Action Issued in U.S. Appl. No. 13/471,393", dated Jul. 24, 2020, 22 Pages.
"Office Action Issued in European Patent Application No. 13858620.1", dated Jul. 13, 2020, 5 Pages.
"Office Action Issued In Korean Patent Application No. 10-2014-7024479", dated Jul. 22, 2019, 18 Pages.
"Office Action Issued In Korean Patent Application No. 10-2014-7024479", dated Jan. 30, 2020, 10 Pages.
"Notice of Allowance Issued in Korean Patent Application No. 10-2014-7024487", dated Feb. 10, 2020, 5 Pages.
"Office Action Issued in Korean Patent Application No. 10-2014-7024487", dated Aug. 7, 2019, 10 pages.
"Office Action Issued in Korean Patent Application No. 10-2014-7024500", dated Aug. 7, 2019, 15 Pages.
"Office Action Issued in Korean Patent Application No. 10-2014-7024552", dated Aug. 7, 2019, 14 Pages.
"Office Action Issued In Korean Patent Application No. 10-2014-7024555", dated Jul. 22, 2019, 14 Pages.
"Office Action Issued In Korean Patent Application No. 10-2014-7024555", dated Jan. 20, 2020, 10 Pages.
"Office Action Issued in Korean Patent Application No. 10-2014-7024564", dated Jan. 9, 2020, 10 Pages.
"Office Action Issued in Korean Patent Application No. 10-2014-7024564", dated Jul. 25, 2019, 9 Pages.
"Office Action Issued in European Patent Application No. 13758583.2", dated Sep. 26, 2019, 6 Pages.
"Summons to Attend Oral Proceedings Issued in European Patent Application No. 13857958.6", dated Aug. 2, 2019, 9 Pages.
"Office Action Issued in European Patent Application No. 13859280.3", dated Aug. 23, 2019, 5 Pages.
"Final Office Action Issued in U.S. Appl. No. 15/083,008", dated Jan. 16, 2020, 14 Pages.
"Non Final Office Action Issued in U.S. Appl. No. 15/083,008", dated Feb. 28, 2020, 14 Pages.
"Non Final Office Action Issued In U.S. Appl. No. 15/083,008", dated Jul. 19, 2019, 15 Pages.
"Office Action Issued in European Patent Application No. 18157310.6", dated Apr. 6, 2020, 5 Pages.
"Office Action Issued in European Patent Application No. 19164804.7", dated Jun. 21, 2019. 8 Pages.
"Extended European Search Report Issued in European Patent Application No. 20192228.3", dated Dec. 1, 2020, 8 Pages.
"Office Action Issued in Indian Patent Application No. 5767/CHENP/2015", dated Jun. 25, 2020, 6 Pages.
"Non Final Office Action Issued in U.S. Appl. No. 13/471,393", dated Jun. 24, 2021, 25 Pages.
"Final Office Action Issued in U.S. Appl. No. 13/471,393", dated Mar. 8, 2021, 24 Pages.
"Office Action Issued in European Patent Application No. 13859280.3", dated Jan. 15, 2021, 5 Pages.
"Office Action Issued in European Patent Application No. 19164804.7", dated Feb. 2, 2021, 4 Pages.
"Corrected Notice of Allowance", U.S. Appl. No. 13/651,327, (Sep. 12, 2013), 2 pages.
"Corrected Notice of Allowance", U.S. Appl. No. 13/651,327, (Sep. 23, 2013), 2 pages.
"Corrected Notice of Allowance", U.S. Appl. No. 13/651,726, (Sep. 17, 2013), 2 pages.
"Final Office Action", U.S. Appl. No. 13/471,001, (Jul. 25, 2013), 20 pages.
"Final Office Action", U.S. Appl. No. 13/471,139, (Sep. 16, 2013), 13 pages.
"Final Office Action", U.S. Appl. No. 13/471,336, (Aug. 28, 2013), 18 pages.
"Final Office Action", U.S. Appl. No. 13/651,976, (Jul. 25, 2013), 21 pages.
"Final Office Action", U.S. Appl. No. 13/653,321, (Aug. 2, 2013), 17 pages.
"Non-Final Office Action", U.S. Appl. No. 13/527,263, (Jul. 19, 2013), 5 pages.
"Non-Final Office Action", U.S. Appl. No. 13/938,930, (Aug. 29, 2013), 9 pages.
"Non-Final Office Action", U.S. Appl. No. 13/939,002, (Aug. 28, 2013), 6 pages.
"Non-Final Office Action", U.S. Appl. No. 13/939,032, (Aug. 29, 2013), 7 pages.
"PCT Search Report and Written Opinion", Application No. PCT/US2013/029461, (Jun. 21, 2013), 11 pages.
"PCT Search Report and Written Opinion", Application No. PCT/US2013/028948, (Jun. 21, 2013), 11 pages.
"Corrected Notice of Allowance", U.S. Appl. No. 13/471,030, Sep. 30, 2014, 2 pages.
"Corrected Notice of Allowance", U.S. Appl. No. 14/199,924, Sep. 19, 2014, 2 pages.
"Final Office Action", U.S. Appl. No. 13/471,336, Oct. 6, 2014, 13 pages.
"Final Office Action", U.S. Appl. No. 14/200,595, Nov. 19, 2014, 5 pages.
"International Search Report and Written Opinion", Application No. PCT/US2014/043546, Oct. 9, 2014, 10 pages.
"Non-Final Office Action", U.S. Appl. No. 13/780,228, Sep. 15, 2014, 18 pages.
"Notice of Allowance", U.S. Appl. No. 14/277,240, Sep. 16, 2014, 4 pages.
"Non-Final Office Action", U.S. Appl. No. 14/063,912, Jan. 2, 2014, 10 pages.
"Non-Final Office Action", U.S. Appl. No. 13/603,918, Dec. 19, 2013, 12 pages.
"FingerWorks Installation and Operation Guide for the TouchStream ST and TouchStream LP", FingerWorks, Inc. Retrieved from <http://ec1.images-amazon.com/media/i3d/01/A/man-migrate/MANUAL000049862.pdf>, 2002, 14 pages.
"Non-Final Office Action", U.S. Appl. No. 13/651,232, Dec. 5, 2013, 15 pages.
"Non-Final Office Action", U.S. Appl. No. 13/468,918, Dec. 26, 2013, 18 pages.
"Corrected Notice of Allowance", U.S. Appl. No. 13/563,435, Jan. 14, 2014, 2 pages.
"Corrected Notice of Allowance", U.S. Appl. No. 13/563,435, Jan. 22, 2014, 2 pages.
"Notice to Grant", CN Application No. 201320097124.7, Oct. 8, 2013, 2 pages.
"Notice of Allowance", U.S. Appl. No. 13/653,321, Dec. 18, 2013, 4 pages.
"Foreign Office Action", CN Application No. 201320097066.8, Oct. 24, 2013, 5 Pages.
"Non-Final Office Action", U.S. Appl. No. 13/939,002, Dec. 20, 2013, 5 pages.

(56) References Cited

OTHER PUBLICATIONS

"Final Office Action", U.S. Appl. No. 13/939,032, Dec. 20, 2013, 5 pages.
"Restriction Requirement", U.S. Appl. No. 13/468,918, Nov. 29, 2013, 6 pages.
"Restriction Requirement", U.S. Appl. No. 13/715,133, Dec. 3, 2013, 6 pages.
"Notice of Allowance", U.S. Appl. No. 13/565,124, Dec. 24, 2013, 6 pages.
"Notice of Allowance", U.S. Appl. No. 13/715,133, Jan. 6, 2014, 7 pages.
"Restriction Requirement", U.S. Appl. No. 13/603,918, Nov. 27, 2013, 8 pages.
Ramirez, "Applying Solventless Elastomeric Polyurethanes on Concrete in Wastewater Service", In Proceedings: Journal of Protective Coatings and Linings, May 1995, 13 pages.
"Corrected Notice of Allowance", U.S. Appl. No. 14/277,240, Jan. 8, 2015, 2 pages.
"Final Office Action", U.S. Appl. No. 14/225,276, Dec. 17, 2014, 6 pages.
"First Examination Report", NZ Application No. 628690, Nov. 27, 2014, 2 pages.
"Non-Final Office Action", U.S. Appl. No. 13/471,030, Jan. 15, 2015, 7 pages.
"Non-Final Office Action", U.S. Appl. No. 14/147,252, Feb. 23, 2015, 11 pages.
"Notice of Allowance", U.S. Appl. No. 13/651,976, Jan. 21, 2015, 10 pages.
"Notice of Allowance", U.S. Appl. No. 14/200,595, Feb. 17, 2015, 2 pages.
"Restriction Requirement", U.S. Appl. No. 14/147,252, Dec. 1, 2014, 6 pages.
"Supplemental Notice of Allowance", U.S. Appl. No. 13/471,405, Dec. 17, 2014, 5 pages.
"Advisory Action", U.S. Appl. No. 13/939,032, Feb. 24, 2014, 2 pages.
"Notice of Allowance", U.S. Appl. No. 13/938,930, Feb. 20, 2014, 4 pages.
"Notice of Allowance", U.S. Appl. No. 13/939,002, Mar. 3, 2014, 4 pages.
"Notice of Allowance", U.S. Appl. No. 13/471,139, Mar. 17, 2014, 4 pages.
"Corrected Notice of Allowance", U.S. Appl. No. 13/651,232, Apr. 24, 2015, 2 pages.
"Corrected Notice of Allowance", U.S. Appl. No. 13/656,055, Apr. 13, 2015, 2 pages.
"Corrected Notice of Allowance", U.S. Appl. No. 13/715,229, Apr. 16, 2015, 2 pages.
"Corrected Notice of Allowance", U.S. Appl. No. 14/177,018, Mar. 2, 2015, 2 pages.
"Ex Parte Quayle Action", U.S. Appl. No. 13/599,763, Nov. 14, 2014, 6 pages.
"Final Office Action", U.S. Appl. No. 13/468,949, Oct. 6, 2014, 11 pages.
"Final Office Action", U.S. Appl. No. 13/471,054, Oct. 23, 2014, 17 pages.
"Final Office Action", U.S. Appl. No. 13/471,412, Dec. 15, 2014, 11 pages.
"Final Office Action", U.S. Appl. No. 13/492,232, Nov. 17, 2014, 13 pages.
"Final Office Action", U.S. Appl. No. 13/595,700, Oct. 9, 2014, 8 pages.
"Final Office Action", U.S. Appl. No. 13/647,479, Dec. 12, 2014, 12 pages.
"Final Office Action", U.S. Appl. No. 13/655,065, Apr. 2, 2015, 23 pages.
"Final Office Action", U.S. Appl. No. 13/656,055, Sep. 17, 2014, 10 pages.
"Final Office Action", U.S. Appl. No. 13/780,228, Apr. 10, 2015, 19 pages.
"Final Office Action", U.S. Appl. No. 13/974,994, Oct. 6, 2014, 26 pages.
"Final Office Action", U.S. Appl. No. 13/975,087, Sep. 10, 2014, 19 pages.
"Final Office Action", U.S. Appl. No. 14/225,250, Mar. 13, 2015, 7 pages.
"Foreign Notice on Reexamination", CN Application No. 201320097066.8, Apr. 3, 2015, 7 Pages.
"Foreign Office Action", CN Application No. 201320097079.5, Jul. 28, 2014, 4 pages.
"neXus Charging Cradle", Retrieved from <http://www.gen-xtech.com/neXus.php> on Jul. 28, 2014, Apr. 17, 2012, 2 pages.
"Non-Final Office Action", U.S. Appl. No. 13/471,054, Mar. 13, 2015, 18 pages.
"Non-Final Office Action", U.S. Appl. No. 13/471,376, Mar. 27, 2015, 28 pages.
"Non-Final Office Action", U.S. Appl. No. 13/471,393, Mar. 26, 2015, 13 pages.
"Non-Final Office Action", U.S. Appl. No. 13/471,393, Oct. 20, 2014, 12 pages.
"Non-Final Office Action", U.S. Appl. No. 13/492,232, Feb. 24, 2015, 12 pages.
"Non-Final Office Action", U.S. Appl. No. 13/525,614, Nov. 24, 2014, 19 pages.
"Non-Final Office Action", U.S. Appl. No. 13/653,184, Dec. 1, 2014, 7 pages.
"Non-Final Office Action", U.S. Appl. No. 13/653,218, Mar. 4, 2015, 16 pages.
"Non-Final Office Action", U.S. Appl. No. 13/655,065, Dec. 19, 2014, 24 pages.
"Non-Final Office Action", U.S. Appl. No. 13/852,848, Mar. 26, 2015, 7 pages.
"Non-Final Office Action", U.S. Appl. No. 13/974,994, Jan. 23, 2015, 26 pages.
"Non-Final Office Action", U.S. Appl. No. 13/975,087, Feb. 27, 2015, 20 pages.
"Non-Final Office Action", U.S. Appl. No. 14/059,280, Mar. 3, 2015, 18 pages.
"Non-Final Office Action", U.S. Appl. No. 14/225,276, Apr. 23, 2015, 7 pages.
"Notice of Allowance", U.S. Appl. No. 13/468,949, Apr. 24, 2015, 9 pages.
"Notice of Allowance", U.S. Appl. No. 13/468,918, Apr. 8, 2015, 7 pages.
"Notice of Allowance", U.S. Appl. No. 13/471,030, Apr. 6, 2015, 6 pages.
"Notice of Allowance", U.S. Appl. No. 13/599,763, Feb. 18, 2015, 4 pages.
"Notice of Allowance", U.S. Appl. No. 13/603,918, Jan. 22, 2015, 8 pages.
"Notice of Allowance", U.S. Appl. No. 13/651,232, Mar. 30, 2015, 7 pages.
"Notice of Allowance", U.S. Appl. No. 13/653,184, Mar. 10, 2015, 6 pages.
"Notice of Allowance", U.S. Appl. No. 13/653,682, Sep. 24, 2014, 4 pages.
"Notice of Allowance", U.S. Appl. No. 13/656,055, Mar. 4, 2015, 7 pages.
"Notice of Allowance", U.S. Appl. No. 13/666,958, Aug. 29, 2014, 9 pages.
"Notice of Allowance", U.S. Appl. No. 13/715,229, Jan. 9, 2015, 6 pages.
"Notice of Allowance", U.S. Appl. No. 14/177,018, Nov. 21, 2014, 7 pages.
"Notice of Allowance", U.S. Appl. No. 14/200,595, Feb. 25, 2015, 4 pages.
"Rechargeable Stylus Pen", Retrieved from <http://www.e-pens.com/uk/rechargeable-stylus-pen.html> on Jul. 28, 2014, Jul. 5, 2013, 1 pages.
"Restriction Requirement", U.S. Appl. No. 13/653,218, Nov. 7, 2014, 6 pages.
"Snugg iPad 3 Keyboard Case—Cover Ultra Slim Bluetooth Keyboard Case for the iPad 3 & iPad 2", Retrieved from <https://web.

(56) References Cited

OTHER PUBLICATIONS archive.org/web/20120810202056/http://www.amazon.com/Snugg-iPad-Keyboard-Case-Bluetooth/dp/B008CCHXJE> on Jan. 23, 2015, Aug. 10, 2012, 4 pages.
"Supplemental Notice of Allowance", U.S. Appl. No. 13/595,700, Apr. 10, 2015, 2 pages.
"Supplemental Notice of Allowance", U.S. Appl. No. 13/603,918, Apr. 20, 2015, 8 pages.
"Writer 1 for iPad 1 keyboard + Case (Aluminum Bluetooth Keyboard, Quick Eject and Easy Angle Function!)", Retrieved from <https://web.archive.org/web/20120817053825/http://www.amazon.com/keyboard-Aluminum-Bluetooth-Keyboard-Function/dp/B004OQLSLG> on Jan. 23, 2015, Aug. 17, 2012, 5 pages.
Harrison, "UIST 2009 Student Innovation Contest—Demo Video", Retrieved From: <https://www.youtube.com/watch?v=PDI8eYIASf0> Sep. 16, 2014, Jul. 23, 2009, 1 pages.
Schafer, "Using Interactive Maps for Navigation and Collaboration", CHI '01 Extended Abstracts on Human Factors in Computing Systems, Mar. 31, 2001, 2 pages.
Van "Lenovo Thinkpad Tablet 2 Review", Retrieved from: <http://www.digitaltrends.com/tablet-reviews/lenovo-thinkpad-tablet-2-review/> Jan. 29, 2014, Feb. 12, 2013, 7 Pages.
"Accessing Device Sensors", retrieved from <https://developer.palm.com/content/api/dev-guide/pdk/accessing-device-sensors.html> on May 25, 2012, 4 pages.
"ACPI Docking for Windows Operating Systems", Retrieved from: <http://www.scritube.com/limba/engleza/software/ACPI-Docking-for-Windows-Opera331824193.php> on Jul. 6, 2012, 10 pages.
"Cholesteric Liquid Crystal", Retrieved from: <http://en.wikipedia.org/wiki/Cholesteric_liquid_crystal> on Aug. 6, 2012,(Jun. 10, 2012), 2 pages.
"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, (Jan. 2013), 1 page.
"Corrected Notice of Allowance", U.S. Appl. No. 13/470,633, (Apr. 9, 2013), 2 pages.
"Corrected Notice of Allowance", U.S. Appl. No. 13/470,633, (Jul. 2, 2013), 2 pages.
"Developing Next-Generation Human Interfaces using Capacitive and Infrared Proximity Sensing", *Silicon Laboratories, Inc.*, Available at <http://www.silabs.com/pages/DownloadDoc.aspx?FILEURL=%support%20documents/technicaldocs/capacitive%20and%20proximity%20sensing_wp.pdf&src=SearchResults>,(Aug. 30, 2010), pp. 1-10.
"Directional Backlighting for Display Panels", U.S. Appl. No. 13/021,448, (Feb. 4, 2011), 38 pages.
"DR2PA", retrieved from <http://www.architainment.co.uk/wp-content/uploads/2012/08/DR2PA-AU-US-size-Data-Sheet-Rev-H_LOGO.pdf> on Sep. 17, 2012, 4 pages.
"Final Office Action", U.S. Appl. No. 13/651,195, (Apr. 18, 2013), 13 pages.
"Final Office Action", U.S. Appl. No. 13/651,232, (May 21, 2013), 21 pages.
"Final Office Action", U.S. Appl. No. 13/651,287, (May 3, 2013), 16 pages.
"First One Handed Fabric Keyboard with Bluetooth Wireless Technology", Retrieved from: <http://press.xtvworld.com/article3817.html> on May 8, 2012,(Jan. 6, 2005), 2 pages.
"Force and Position Sensing Resistors: An Emerging Technology", *Interlink Electronics*, Available at <http://staff.science.uva.nl/~vlaander/docu/FSR/An_Exploring_Technology.pdf>,(Feb. 1990), pp. 1-6.
"Frogpad Introduces Weareable Fabric Keyboard with Bluetooth Technology", Retrieved from: <http://www.geekzone.co.nz/content.asp?contentid=3898> on May 7, 2012,(Jan. 7, 2005), 3 pages.
"How to Use the iPad's Onscreen Keyboard", Retrieved from <http://www.dummies.com/how-to/content/how-to-use-the-ipads-onscreen-keyboard.html> on Aug. 28, 2012, 3 pages.
"i-Interactor electronic pen", Retrieved from: <http://www.alibaba.com/product-gs/331004878/i_Interactor_electronic_pen.html> on Jun. 19, 2012, 5 pages.
"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.
"Membrane Keyboards & Membrane Keypads", Retrieved from: <http://www.pannam.com/> on May 9, 2012,(Mar. 4, 2009), 2 pages.
"Motion Sensors", *Android Developers*, retrieved from <http://developer.android.com/guide/topics/sensors/sensors_motion.html> May 25, 2012, 7 pages.
"MPC Fly Music Production Controller", *AKAI Professional*, <http://www.akaiprompc.com/mpc-fly> on Jul. 9, 2012, 4 pages.
"NI Releases New Maschine & Maschine Mikro", Retrieved from <http://www.djbooth.net/index/dj-equipment/entry/ni-releases-new-maschine-mikro/> on Sep. 17, 2012, 19 pages.
"Non-Final Office Action", U.S. Appl. No. 13/021,448, (Dec. 13, 2012), 9 pages.
"Non-Final Office Action", U.S. Appl. No. 13/471,001, (Feb. 19, 2013), 15 pages.
"Non-Final Office Action", U.S. Appl. No. 13/471,139, (Mar. 21, 2013), 12 pages.
"Non-Final Office Action", U.S. Appl. No. 13/471,202, (Feb. 11, 2013), 10 pages.
"Non-Final Office Action", U.S. Appl. No. 13/471,336, (Jan. 18, 2013), 14 pages.
"Non-Final Office Action", U.S. Appl. No. 13/563,435, (Jun. 14, 2013), 6 pages.
"Non-Final Office Action", U.S. Appl. No. 13/564,520, (Jun. 19, 2013), 8 pages.
"Non-Final Office Action", U.S. Appl. No. 13/565,124, (Jun. 17, 2013), 5 pages.
"Non-Final Office Action", U.S. Appl. No. 13/651,195, (Jan. 2, 2013), 14 pages.
"Non-Final Office Action", U.S. Appl. No. 13/651,232, (Jan. 17, 2013), 15 pages.
"Non-Final Office Action", U.S. Appl. No. 13/651,272, (Feb. 12, 2013), 10 pages.
"Non-Final Office Action", U.S. Appl. No. 13/651,287, (Jan. 29, 2013), 13 pages.
"Non-Final Office Action", U.S. Appl. No. 13/651,304, (Mar. 22, 2013), 9 pages.
"Non-Final Office Action", U.S. Appl. No. 13/651,327, (Mar. 22, 2013), 6 pages.
"Non-Final Office Action", U.S. Appl. No. 13/651,726, (Apr. 15, 2013), 6 pages.
"Non-Final Office Action", U.S. Appl. No. 13/651,871, (Mar. 18, 2013), 14 pages.
"Non-Final Office Action", U.S. Appl. No. 13/651 871 (Jul. 1, 2013), 5 pages.
"Non-Final Office Action", U.S. Appl. No. 13/651,976, (Feb. 22, 2013), 16 pages.
"Non-Final Office Action", U.S. Appl. No. 13/653,321, (Feb. 1, 2013), 13 pages.
"Non-Final Office Action", U.S. Appl. No. 13/653,682, (Feb. 7, 2013), 11 pages.
"Non-Final Office Action", U.S. Appl. No. 13/653,682, (Jun. 3, 2013), 14 pages.
"Non-Final Office Action", U.S. Appl. No. 13/656,055, (Apr. 23, 2013), 11 pages.
"Non-Final Office Action", U.S. Appl. No. 13/656,520, (Feb. 1, 2013), 15 pages.
"Non-Final Office Action", U.S. Appl. No. 13/656,520, (Jun. 5, 2013), 8 pages.
"Notice of Allowance", U.S. Appl. No. 13/470,633, (Mar. 22, 2013), 7 pages.
"Notice of Allowance", U.S. Appl. No. 13/471,202, (May 28, 2013), 7 pages.
"Notice of Allowance", U.S. Appl. No. 13/651,195, (Jul. 8, 2013), 9 pages.
"Notice of Allowance", U.S. Appl. No. 13/651,272, (May 2, 2013), 7 pages.

(56) References Cited

OTHER PUBLICATIONS

"Notice of Allowance", U.S. Appl. No. 13/651,304, (Jul. 1, 2013), 5 pages.
"Notice of Allowance", U.S. Appl. No. 13/651,327, (Jun. 11, 2013), 7 pages.
"Notice of Allowance", U.S. Appl. No. 13/651,726, (May 31, 2013), 5 pages.
"On-Screen Keyboard for Windows 7, Vista, XP with Touchscreen", Retrieved from <www.comfort-software.com/on-screen-keyboard.html> on Aug. 28, 2012, Feb. 2, 2011, 3 pages.
"Optical Sensors in Smart Mobile Devices", *ON Semiconductor*, TND415/D, Available at <http://www.onsemi.jp/pub_link/Collateral/TND415-D.PDF>,(Nov. 2010), pp. 1-13.
"Optics for Displays: Waveguide-based Wedge Creates Collimated Display Backlight", *OptolQ*, retrieved from <http://www.optoiq.com/index/photonics-technologies-applications/lfw-display/lfw-article-display-articles.laser-focus-world.volume-46.issue-1.world-news.optics-for_displays.html> on Nov. 2, 2010,(Jan. 1, 2010), 3 pages.
"Position Sensors", *Android Developers*, <http://developer.android.com/guide/topics/sensors/sensors_position.html> May 25, 2012, 5 pages.
"Reflex LCD Writing Tablets", retrieved from <http://www.kentdisplays.com/products/lcdwritingtablets.html> on Jun. 27, 2012, 3 pages.
"Restriction Requirement", U.S. Appl. No. 13/471,139, (Jan. 17, 2013), 7 pages.
"Restriction Requirement", U.S. Appl. No. 13/651,304, (Jan. 18, 2013), 7 pages.
"Restriction Requirement", U.S. Appl. No. 13/651,726, (Feb. 22, 2013), 6 pages.
"Restriction Requirement", U.S. Appl. No. 13/651,871, (Feb. 7, 2013), 6 pages.
"SMART Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>,(2009), 2 pages.
"SolRxTM E-Series Multidirectional Phototherapy ExpandableTM 2-Bulb Full Body Panel System", Retrieved from: <http://www.solarcsystems.com/us_multidirectional_uv_light_therapy_1_intro.html > on Jul. 25, 2012,(2011), 4 pages.
"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, (Jun. 2012), 2 pages.
"Tilt Shift Lenses: Perspective Control", retrieved from http://www.cambridgeincolour.com/tutorials/tilt-shift-lenses1.htm, (Mar. 28, 2008), 11 Pages.
"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.
"What is Active Alignment?", http://www.kasalis.com/active_alignment.html, retrieved on Nov. 22, 2012, 2 Pages.
Block, Steve et al., "DeviceOrientation Event Specification", *W3C, Editor's Draft*, retrieved from <https://developer.palm.com/content/api/dev-guide/pdk/accessing-device-sensors.html> May 25, 2012,(Jul. 12, 2011), 14 pages.
Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.
Butler, Alex et al., "SideSight: Multi-"touch" Interaction around Small Devices", *In the proceedings of the 21st annual ACM Symposium on User interface software and technology.*, retrieved from <http://research.microsoft.com/pubs/132534/sidesight_crv3.pdf> May 29, 2012,(Oct. 19, 2008), 4 pages.
Crider, Michael "Sony Slate Concept Tablet "Grows" a Kickstand", Retrieved from: <http://androidcommunity.com/sony-slate-concept-tablet-grows-a-kickstand-20120116/> on May 4, 2012,(Jan. 16, 2012), 9 pages.
Das, Apurba et al., "Study of Heat Transfer through Multilayer Clothing Assemblies: A Theoretical Prediction", Retrieved from http://www.autexrj.com/cms/zalaczone_pliki/5_013_11.pdf>, (Jun. 2011), 7 pages.
Dietz, Paul H., et al., "A Practical Pressure Sensitive Computer Keyboard", In Proceedings of UIST 2009,(Oct. 2009), 4 pages.
Gaver, William W., et al, "A Virtual Window on Media Space", retrieved from <http://www.gold.ac.uk/media/15gaver-smets-overbeeke.MediaSpaceWindow.chi95.pdf> on Jun. 1, 2012, retrieved from <http://www.gold.ac.uk/media/15gaver-smets-overbeeke.MediaSpaceWindow.chi95.pdf> on Jun. 1, 2012,(May 7, 1995), 9 pages.
Glatt, Jeff "Channel and Key Pressure (Aftertouch).", Retrieved from: <http://home.roadrunner.com/~jgglatt/tutr/touch.htm> on Jun. 11, 2012,2 pages.
Hanlon, Mike "ElekTex Smart Fabric Keyboard Goes Wireless", Retrieved from: <http://www.gizmag.com/go/5048/ > on May 7, 2012,(Jan. 15, 2006), 5 pages.
Harada, Susumu et al., "VoiceDraw: A Hands-Free Voice-Driven Drawing Application for People With Motor Impairments", *In Proceedings of Ninth International ACM SIGACCESS Conference on Computers and Accessibility*, retrieved from <http://citeseerx.ist.psu.edu/viewdoc/download?doi=10.1.1.113.7211&rep=rep1&type=pdf> on Jun. 1, 2012,(Oct. 15, 2007), 8 pages.
Iwase, Eiji "Multistep Sequential Batch Assembly of Three-Dimensional Ferromagnetic Microstructures with Elastic Hinges", Retrieved at «http://ieeexplore.ieee.org/stamp/stamp.jsp?tp=&arnumber=1549861» *Proceedings: Journal of Microelectromechanical Systems*, (Dec. 2005), 7 pages.
Kaufmann, Benoit et al., "Hand Posture Recognition Using Real-time Artificial Evolution", *EvoApplications'09*, retrieved from <http://evelyne.lutton.free.fr/Papers/KaufmannEvolASP2010.pdf> on Jan. 5, 2012,(Apr. 3, 2010), 10 pages.
Kaur, Sukhmani "Vincent Liew's redesigned laptop satisfies ergonomic needs", Retrieved from: <http://www.designbuzz.com/entry/vincent-liew-s-redesigned-laptop- satisfies-ergonomic-needs/> on Jul. 27, 2012,(Jun. 21, 2010), 4 pages.
Khuntontong, Puttachat et al., "Fabrication of Molded Interconnection Devices by Ultrasonic Hot Embossing on Thin Polymer Films", IEEE Transactions on Electronics Packaging Manufacturing, vol. 32, No. 3,(Jul. 2009), pp. 152-156.
Li, et al., "Characteristic Mode Based Tradeoff Analysis of Antenna-Chassis Interactions for Mulitple Antenna Terminals", *In IEEE Transactions on Antennas and Propagation*, <http://ieeexplore.ieee.org/stamp/stamp.jsp?tp=&arnumber=6060882>s,(Feb. 2012), 13 pages.
Linderholm, Owen "Logitech Shows Cloth Keyboard for PDAs", Retrieved from: <http://www.pcworld.com/article/89084/logitech_shows_cloth_keyboard_for_pdas.html> on May 7, 2012,(Mar. 15, 2002), 5 pages.
Manresa-Yee, Cristina et al., "Experiences Using a Hands-Free Interface", *In Proceedings of the 10th International ACM SIGACCESS Conference on Computers and Accessibility*, retrieved from <http://dmi.uib.es/~cmanresay/Research/%5BMan08%.pdf> Jun. 1, 2012,(Oct. 13, 2008), pp. 261-262.
McLellan, Charles "Eleksen Wireless Fabric Keyboard: a first look", Retrieved from: <http://www.zdnetasia.com/eleksen-wireless-fabric-keyboard-a-first-look-40278954.htm> on May 7, 2012,(Jul. 17, 2006), 9 pages.
Nakanishi, Hideyuki et al., "Movable Cameras Enhance Social Telepresence in Media Spaces", *In Proceedings of the 27th International Conference on Human Factors in Computing Systems*, retrieved from <http://smg.ams.eng.osaka-u.ac.jp/~nakanishi/hnp_2009_chi.pdf> on Jun. 1, 2012,(Apr. 6, 2009), 10 pages.
Piltch, Avram "ASUS Eee Pad Slider SL 101 Review", Retrieved from <http://www.laptopmag.com/review/tablets/asus-eee-pad-slider-sl101.aspx>, Sep. 22, 2011, 5 pages.
Post, E.R. et al., "E-Broidery: Design and Fabrication of Textile-Based Computing", IBM Systems Journal, vol. 39, Issue 3 & 4,(Jul. 2000), pp. 840-860.

(56) References Cited

OTHER PUBLICATIONS

Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012), 15 pages.
Qin, Yongqiang et al., "pPen: Enabling Authenticated Pen and Touch Interaction on Tabletop Surfaces", *In Proceedings of ITS* 2010, Available<http://www.dfki.de/its2010/papers/pdf/po172.pdf>,(Nov. 2010), pp. 283-284.
Reilink, Rob et al., "Endoscopic Camera Control by Head Movements for Thoracic Surgery", *In Proceedings of 3rd IEEE RAS & EMBS International Conference of Biomedical Robotics and Biomechatronics*, retrieved from <http://doc.utwente.nl/74929/1/biorob_online.pdf> on Jun. 1, 2012,(Sep. 26, 2010), pp. 510-515.
Sumimoto, Mark "Touch & Write: Surface Computing With Touch and Pen Input", Retrieved from: <http://www.gottabemobile.com/2009/08/07/touch-write-surface-computing-with-touch-and-pen-input/> on Jun. 19, 2012,(Aug. 7, 2009), 4 pages.
Sundstedt, Veronica "Gazing at Games: Using Eye Tracking to control Virtual Characters", *In ACM SIGGRAPH 2010 Courses*, retrieved from <http://www.tobii.com/Global/Analysis/Training/EyeTrackAwards/veronica_sundstedtpdf> Jun. 1, 2012,(Jul. 28, 2010), 85 pages.
Takamatsu, Seiichi et al., "Flexible Fabric Keyboard with Conductive Polymer-Coated Fibers", In Proceedings of Sensors 2011,(Oct. 28, 2011), 4 pages.
Travis, Adrian et al., "Collimated Light from a Waveguide for a Display Backlight", *Optics Express*, 19714, vol. 17, No. 22, retrieved from <http://download.microsoft.com/download/D/2/E/D2E425F8-CF3C-4C71-A4A2-70F9D4081007/OpticsExpressbacklightpaper.pdf> on Oct. 15, 2009, 6 pages.
Travis, Adrian et al., "The Design of Backlights for View-Sequential 3D", retrieved from <http://download.microsoft.com/download/D/2/E/D2E425F8-CF3C-4C71-A4A2-70F9D4081007/Backlightforviewsequentialautostereo.docx> on Nov. 1, 2010, 4 pages.
Valli, Alessandro "Notes on Natural Interaction", retrieved from <http://www.idemployee.id.tue.nl/g.w.m.rauterberg/lecturenotes/valli-2004.pdf> on Jan. 5, 2012,(Sep. 2005), 80 pages.
Valliath, G T., "Design of Hologram for Brightness Enhancement in Color LCDs", Retrieved from <http://www.loreti.it/Download/PDF/LCD/44_05.pdf> on Sep. 17, 2012, 5 pages.
Vaucelle, Cati "Scopemate, A Robotic Microscope!", *Architectradure*, retrieved from <http://architectradure.blogspot.com/2011/10/at-uist-this-monday-scopemate-robotic.html> on Jun. 6, 2012,(Oct. 17, 2011), 2 pages.
Williams, Jim "A Fourth Generation of LCD Backlight Technology", Retrieved from <http://cds.linear.com/docs/Application%20Note/an65f.pdf>, (Nov. 1995), 124 pages.
Xu, Zhang et al., "Hand Gesture Recognition and Virtual Game Control Based on 3D Accelerometer and EMG Sensors", *IUI'09*, Feb. 8-11, 2009, retrieved from <http://sclab.yonsei.ac.kr/courses/10TPR/10TPR.files/Hand%20Gesture%20Recognition%20and%20Virtual%20Game%20Control%20based%20on%203d%20accelerometer%20and%20EMG%20sensors.pdf> on Jan. 5, 2012,(Feb. 8, 2009), 5 pages.
Xu, Zhi-Gang et al., "Vision-based Detection of Dynamic Gesture", *ICTM'09*, Dec. 5-6, 2009, retrieved from <http://ieeexplore.ieee.org/stamp/stamp.jsp?tp=&arnumber=5412956> on Jan. 5, 2012,(Dec. 5, 2009), pp. 223-226.
Zhang, et al., "Model-Based Development of Dynamically Adaptive Software", *In Proceedings of ICSE 2006*, Available at <http://www.irisa.fr/lande/lande/icse-proceedings/icse/p371.pdf>,(May 20, 2006), pp. 371-380.
Zhu, Dingyun et al., "Keyboard before Head Tracking Depresses User Success in Remote Camera Control", *In Proceedings of 12th IFIP TC 13 International Conference on Human-Computer Interaction, Part II*, retrieved from <http://csiro.academia.edu/Departments/CSIRO_ICT_Centre/Papers?page=5> on Jun. 1, 2012,(Aug. 24, 2009),14 pages.
"Corrected Notice of Allowance", U.S. Appl. No. 13/651,232, Jun. 10, 2015, 2 pages.
"Corrected Notice of Allowance", U.S. Appl. No. 13/651,232, Jul. 6, 2015, 2 pages.
"Corrected Notice of Allowance", U.S. Appl. No. 14/200,595, Jun. 4, 2015, 3 pages.
"Final Office Action", U.S. Appl. No. 14/059,280, Jul. 22, 2015, 25 pages.
"Final Office Action", U.S. Appl. No. 14/147,252, Jun. 25, 2015, 11 pages.
"Foreign Office Action", CN Application No. 201310067335.0, Jun. 12, 2015, 15 Pages.
"Non-Final Office Action", U.S. Appl. No. 13/471,336, Jun. 24, 2015, 15 pages.
"Non-Final Office Action", U.S. Appl. No. 14/727,001, Jul. 10, 2015, 7 pages.
"Notice of Allowance", U.S. Appl. No. 14/225,276, Jun. 22, 2015, 4 pages.
"Notice of Allowance", U.S. Appl. No. 14/457,881, Jul. 22, 2015, 7 pages.
"Supplemental Notice of Allowance", U.S. Appl. No. 13/468,918, Jun. 4, 2015, 2 pages.
"Supplemental Notice of Allowance", U.S. Appl. No. 13/468,949, Jun. 5, 2015, 2 pages.
Cunningham,"Software Infrastructure for Natural Language Processing", In Proceedings of the fifth conference on Applied natural language processing, Mar. 31, 1997, pp. 237-244.
"Advisory Action", U.S. Appl. No. 14/059,280, Sep. 25, 2015, 7 pages.
"Corrected Notice of Allowance", U.S. Appl. No. 13/471,030, Aug. 10, 2015, 2 pages.
"Corrected Notice of Allowance", U.S. Appl. No. 14/225,276, Aug. 27, 2015, 2 pages.
"Corrected Notice of Allowance", U.S. Appl. No. 14/225,276, Sep. 29, 2015, 2 pages.
"Corrected Notice of Allowance", U.S. Appl. No. 14/457,881, Aug. 20, 2015, 2 pages.
"Corrected Notice of Allowance", U.S. Appl. No. 14/457,881, Oct. 2, 2015, 2 pages.
"Extended European Search Report", EP Application No. 13859280.3, Sep. 7, 2015, 6 pages.
"Extended European Search Report", EP Application No. 13859406.4, Sep. 8, 2015, 6 pages.
"Foreign Office Action", CN Application No. 201310067592.4, Oct. 23, 2015, 12 Pages.
"Non-Final Office Action", U.S. Appl. No. 14/162,529, Sep. 18, 2015, 13 pages.
"Non-Final Office Action", U.S. Appl. No. 14/225,250, Aug. 19, 2015, 9 pages.
"Non-Final Office Action", U.S. Appl. No. 14/225,276, Aug. 19, 2015, 9 pages.
"Notice of Allowance", U.S. Appl. No. 14/727,001, Oct. 2, 2015, 4 pages.
"Supplemental Notice of Allowance", U.S. Appl. No. 13/468,918, Aug. 7, 2015, 4 pages.
"Supplemental Notice of Allowance", U.S. Appl. No. 13/468,949, Sep. 14, 2015, 2 pages.
"Advanced Configuration and Power Management Specification", *Intel Corporation, Microsoft Corporation, Toshiba Corp. Revision* 1, (Dec. 22. 1996), 364 pages.
"Final Office Action", U.S. Appl. No. 13/653,682, (Oct. 18, 2013), 16 pages.
"Final Office Action", U.S. Appl. No. 13/656,055, (Oct. 23, 2013), 14 pages.
"Final Office Action", U.S. Appl. No. 13/938,930, (Nov. 8, 2013), 10 pages.
"Final Office Action", U.S. Appl. No. 13/939,002, (Nov. 8, 2013), 7 pages.
"International Search Report and Written Opinion", Application No. PCT/US2013/044871, (Aug. 14, 2013), 12 pages.
"International Search Report and Written Opinion", Application No. PCT/US2013/040968, (Sep. 5, 2013), 12 pages.

(56) References Cited

OTHER PUBLICATIONS

"International Search Report and Written Opinion", Application No. PCT/US2013/045049, (Sep. 16, 2013), 9 pages.
"International Search Report and Written Opinion", Application No. PCT/US2013/042550, (Sep. 24, 2013),14 pages.
"Non-Final Office Action", U.S. Appl. No. 13/371,725, (Nov. 7, 2013), 19 pages.
"Non-Final Office Action", U.S. Appl. No. 13/780,228, (Oct. 30, 2013), 12 pages.
"Notice of Allowance", U.S. Appl. No. 13/563,435, (Nov. 12, 2013), 5 pages.
"Notice of Allowance", U.S. Appl. No. 13/651,871, (Oct. 2, 2013), 7 pages.
"Notice of Allowance", U.S. Appl. No. 13/656,520, (Oct. 2, 2013), 5 pages.
"Notice to Grant", CN Application No. 201320097089.9, (Sep. 29, 2013), 2 Pages.
"Restriction Requirement", U.S. Appl. No. 13/715,133, (Oct. 28, 2013), 6 pages.
"Restriction Requirement", U.S. Appl. No. 13/715,229, (Aug. 13, 2013), 7 pages.
"Welcome to Windows 7", Retrieved from: <http://www.microsoft.com/en-us/download/confirmation.aspx?id=4984> on Aug. 1, 2013, (Sep. 16, 2009), 3 pages.
"Write & Learn Spellboard Advanced", Available at <http://somemanuals.com/VTECH,WRITE%2526LEARN--SPELLBOARD--ADV--71000,J1DFHE.PDF>, (2006), 22 pages.
Bathiche, Steven N., et al., "Input Device with Interchangeable Surface", U.S. Appl. No. 13/974,749, (Aug. 23, 2013), 51 pages.
Lance, David M., et al., "Media Processing Input Device", U.S. Appl. No. 13/655,065, filed Oct. 18, 2012, 43 pages.
Prospero, Michael "Samsung Outs Series Hybrid PC Tablet", Retrieved from: http://blog.laptopmag.com/samsung-outs-series-5-hybrid-pc-tablet-running-windows-8> on Oct. 31, 2013, (Jun. 4, 2012), 7 pages.
"Advisory Action", U.S. Appl. No. 14/199,924, May 28, 2014, 2 pages.
"Corrected Notice of Allowance", U.S. Appl. No. 13/656,520, Jan. 16, 2014, 3 pages.
"Corrected Notice of Allowance", U.S. Appl. No. 13/715,133, Apr. 2, 2014, 2 pages.
"Corrected Notice of Allowance", U.S. Appl. No. 13/938,930, Jun. 6, 2014, 2 pages.
"Corrected Notice of Allowance", U.S. Appl. No. 13/939,002, Jun. 19, 2014, 2 pages.
"Corrected Notice of Allowance", U.S. Appl. No. 13/939,032, Jun. 26, 2014, 2 pages.
"Corrected Notice of Allowance", U.S. Appl. No. 13/939,032, Jul. 15, 2014, 2 pages.
"Final Office Action", U.S. Appl. No. 13/653,682, Jun. 11, 2014, 11 pages.
"Foreign Notice of Allowance", CN Application No. 201320096755.7, Jan. 27, 2014, 2 pages.
"Foreign Office Action", CN Application No. 201320097079.5, Sep. 26, 2013, 4 pages.
"Interlink Electronics FSR (TM) Force Sensing Resistors (TM)", Retrieved at «http://akizukidenshi.com/download/ds/interlinkelec/94-00004+Rev+B%20FSR%201ntegration%20Guide.pdf on Mar. 21, 2013, 36 pages.
"International Search Report and Written Opinion", Application No. PCT/US2014/031531, Jun. 20, 2014, 10 Pages.
"International Search Report and Written Opinion", Application No. PCT/US2013/065154, Feb. 5, 2014, 10 pages.
"International Search Report and Written Opinion", Application No. PCT/US2013/067905, Apr. 15, 2014, 9 pages.
"Microsoft Tablet PC", Retrieved from <http://web.archive.org/web/20120622064335/https://en.wikipedia.org/wiki/Microsoft_Tablet_PC> on Jun. 4, 2014, Jun. 21, 2012, 9 pages.
"Non-Final Office Action", U.S. Appl. No. 13/468,949, Jun. 20, 2014, 10 pages.
"Non-Final Office Action", U.S. Appl. No. 13/470,951, Jul. 2, 2014, 19 pages.
"Non-Final Office Action", U.S. Appl. No. 13/471,001, Jun. 17, 2014, 23 pages.
"Non-Final Office Action", U.S. Appl. No. 13/471,030, May 15, 2014, 10 pages.
"Non-Final Office Action", U.S. Appl. No. 13/471,054, Jun. 3, 2014, 15 pages.
"Non-Final Office Action", U.S. Appl. No. 13/564,520, Jun. 16, 2014, 5 pages.
"Non-Final Office Action", U.S. Appl. No. 13/595,700, Jun. 18, 2014, 8 pages.
"Non-Final Office Action", U.S. Appl. No. 13/599,763, May 28, 2014, 6 pages.
"Non-Final Office Action", U.S. Appl. No. 13/645,405, Jan. 31, 2014, 6 pages.
"Non-Final Office Action", U.S. Appl. No. 13/647,479, Jul. 3, 2014, 10 pages.
"Non-Final Office Action", U.S. Appl. No. 13/651,976, Jun. 16, 2014, 23 pages.
"Non-Final Office Action", U.S. Appl. No. 13/974,994, Jun. 4, 2014, 24 pages.
"Non-Final Office Action", U.S. Appl. No. 14/225,250, Jun. 17, 2014, 5 pages.
"Non-Final Office Action", U.S. Appl. No. 14/225,276, Jun. 13, 2014, 6 pages.
"Non-Final Office Action", U.S. Appl. No. 14/277,240, Jun. 13, 2014, 6 pages.
"Notice of Allowance", U.S. Appl. No. 13/468,918, Jun. 17, 2014, 5 pages.
"Notice of Allowance", U.S. Appl. No. 13/471,186, Jul. 3, 2014, 7 pages.
"Notice of Allowance", U.S. Appl. No. 13/471,405, Jun. 24, 2014, 9 pages.
"Notice of Allowance", U.S. Appl. No. 14/199,924, Jun. 10, 2014, 4 pages.
"Restriction Requirement", U.S. Appl. No. 13/595,700, May 28, 2014, 6 pages.
"Supplemental Notice of Allowance", U.S. Appl. No. 14/018,286, Jun. 11, 2014, 5 pages.
"Corrected Notice of Allowance", U.S. Appl. No. 13/563,435, Mar. 20, 2014, 2 pages.
"Corrected Notice of Allowance", U.S. Appl. No. 13/565,124, Apr. 3, 2014, 4 pages.
"Corrected Notice of Allowance", U.S. Appl. No. 13/565,124, Mar. 10, 2014, 2 pages.
"Corrected Notice of Allowance", U.S. Appl. No. 13/565,124, Apr. 14, 2014, 2 pages.
"Corrected Notice of Allowance", U.S. Appl. No. 13/938,930, May 6, 2014, 2 pages.
"Corrected Notice of Allowance", U.S. Appl. No. 13/939,002, May 22, 2014, 2 pages.
"Corrected Notice of Allowance", U.S. Appl. No. 13/939,002, May 5, 2014, 2 pages.
"Final Office Action", U.S. Appl. No. 13/371,725, Apr. 2, 2014, 22 pages.
"Final Office Action", U.S. Appl. No. 13/564,520, Jan. 15, 2014, 7 pages.
"Final Office Action", U.S. Appl. No. 13/603,918, Mar. 21, 2014, 14 pages.
"Final Office Action", U.S. Appl. No. 13/780,228, Mar. 28, 2014, 13 pages.
"Final Office Action", U.S. Appl. No. 14/063,912, Apr. 29, 2014, 10 pages.
"Final Office Action", U.S. Appl. No. 14/199,924, May 6, 2014, 5 pages.
"Foreign Office Action", CN Application No. 201320328022.1, Feb. 17, 2014, 4 Pages.
"Foreign Office Action", CN Application No. 201320328022.1, Oct. 18, 2013, 3 Pages.
"International Search Report and Written Opinion", Application No. PCT/US2013/045283, Mar. 12, 2014, 19 pages.

(56) References Cited

OTHER PUBLICATIONS

"International Search Report and Written Opinion", Application No. PCT/US2013/044873, Nov. 22, 2013, 9 pages.
"Non-Final Office Action", U.S. Appl. No. 13/599,635, Feb. 25, 2014, 13 pages.
"Non-Final Office Action", U.S. Appl. No. 13/471,186, Feb. 27, 2014, 8 pages.
"Non-Final Office Action", U.S. Appl. No. 13/471,237, Mar. 24, 2014, 7 pages.
"Non-Final Office Action", U.S. Appl. No. 13/471,336, May 7, 2014, 17 pages.
"Non-Final Office Action", U.S. Appl. No. 13/471,376, Apr. 2, 2014, 17 pages.
"Non-Final Office Action", U.S. Appl. No. 13/471,405, Feb. 20, 2014, 37 pages.
"Non-Final Office Action", U.S. Appl. No. 13/492,232, Apr. 30, 2014, 9 pages.
"Non-Final Office Action", U.S. Appl. No. 13/527,263, Apr. 3, 2014, 6 pages.
"Non-Final Office Action", U.S. Appl. No. 13/564,520, Feb. 14, 2014, 5 pages.
"Non-Final Office Action", U.S. Appl. No. 13/653,682, Feb. 26, 2014, 10 pages.
"Non-Final Office Action", U.S. Appl. No. 13/655,065, Apr. 24, 2014, 16 pages.
"Non-Final Office Action", U.S. Appl. No. 13/656,055, Mar. 12, 2014, 17 pages.
"Non-Final Office Action", U.S. Appl. No. 13/975,087, May 8, 2014, 18 pages.
"Non-Final Office Action", U.S. Appl. No. 14/199,924, Apr. 10, 2014, 6 pages.
"Non-Final Office Action", U.S. Appl. No. 14/200,595, Apr. 11, 2014, 4 pages.
"Notice of Allowance", U.S. Appl. No. 13/471,237, May 12, 2014, 8 pages.
"Notice of Allowance", U.S. Appl. No. 13/651,232, Apr. 25, 2014, 9 pages.
"Notice of Allowance", U.S. Appl. No. 13/651,287, May 2, 2014, 6 pages.
"Notice of Allowance", U.S. Appl. No. 13/939,032, Apr. 3, 2014, 4 pages.
"Notice of Allowance", U.S. Appl. No. 14/018,286, May 23, 2014, 8 pages.
"Supplemental Notice of Allowance", U.S. Appl. No. 13/653,321, Mar. 28, 2014, 4 pages.
Hinckley, et al., "Codex: A Dual Screen Tablet Computer", Retrieved at «http://www.dgp.utoronto.ca/~ravin/papers/chi2009_codex.pdf», In Proceedings of the 27th International Conference on Human Factors in Computing Systems, Apr. 9, 2009, pp. 10.
"Basic Cam Motion Curves", Retrieved From: <http://ocw.metu.edu.tr/pluginfile.php/6886/mod_resource/content/1/ch8/8-3.htm> Nov. 22, 2013, Middle East Technical University,1999, 14 Pages.
"Corrected Notice of Allowance", U.S. Appl. No. 13/651,232, Jul. 31, 2014, 2 pages.
"Corrected Notice of Allowance", U.S. Appl. No. 13/651,287, Aug. 21, 2014, 2 pages.
"Corrected Notice of Allowance", U.S. Appl. No. 14/199,924, Aug. 29, 2014, 2 pages.
"Corrected Notice of Allowance", U.S. Appl. No. 14/199,924, Sep. 5, 2014, 2 pages.
"Final Office Action", U.S. Appl. No. 13/471,376, Aug. 18, 2014, 24 pages.
"Final Office Action", U.S. Appl. No. 13/595,700, Aug. 15, 2014, 6 pages.
"Final Office Action", U.S. Appl. No. 13/599,635, Aug. 8, 2014, 16 pages.
"Final Office Action", U.S. Appl. No. 13/655,065, Aug. 8, 2014, 20 pages.
"Foreign Notice of Allowance", CN Application No. 201320097065.3, Nov. 21, 2013, 2 pages.
"Foreign Office Action", CN Application No. 201320097065.3, Jun. 18, 2013, 2 pages.
"International Search Report and Written Opinion", Application No. PCT/US2013/028483, Jun. 24, 2014, 10 pages.
"International Search Report and Written Opinion", Application No. PCT/US2013/028484, Jun. 24, 2014, 10 pages.
"International Search Report and Written Opinion", Application No. PCT/US2013/028485, Jun. 25, 2014, 10 pages.
"International Search Report and Written Opinion", Application No. PCT/US2013/028769, Jun. 26, 2014, 10 pages.
"International Search Report and Written Opinion", Application No. PCT/US2013/028771, Jun. 19, 2014, 10 pages.
"International Search Report and Written Opinion", Application No. PCT/US2013/028486, Jun. 20, 2014, 10 pages.
"International Search Report and Written Opinion", Application No. PCT/US2013/041017, Jul. 17, 2014, 10 pages.
"International Search Report and Written Opinion", Application No. PCT/US2013/028489, Jun. 20, 2014, 11 pages.
"International Search Report and Written Opinion", Application No. PCT/US2013/028488, Jun. 24, 2014, 11 pages.
"International Search Report and Written Opinion", Application No. PCT/US2013/028767, Jun. 24, 2014, 11 pages.
"International Search Report and Written Opinion", Application No. PCT/US2014/016654, May 16, 2014, 11 pages.
"International Search Report and Written Opinion", Application No. PCT/US2013/028481, Jun. 19, 2014, 11 pages.
"International Search Report and Written Opinion", Application No. PCT/US2013/028490, Jun. 24, 2014, 11 pages.
"International Search Report and Written Opinion", Application No. PCT/US2013/028766, Jun. 26, 2014, 11 pages.
"International Search Report and Written Opinion", Application No. PCT/US2013/028772, Jun. 30, 2014, 11 pages.
"International Search Report and Written Opinion", Application No. PCT/US2013/028768, Jun. 24, 2014, 12 pages.
"International Search Report and Written Opinion", Application No. PCT/US2013/028482, Jun. 20, 2014, 13 pages.
"International Search Report and Written Opinion", Application No. PCT/US2013/028487, May 27, 2014, 9 pages.
"International Search Report and Written Opinion", Application No. PCT/US2013/028770, Jun. 26, 2014, 9 pages.
"Non-Final Office Action", U.S. Appl. No. 13/468,882, Jul. 9, 2014, 9 pages.
"Non-Final Office Action", U.S. Appl. No. 13/471,282, Sep. 3, 2014, 13 pages.
"Non-Final Office Action", U.S. Appl. No. 13/471,412, Jul. 11, 2014, 22 pages.
"Non-Final Office Action", U.S. Appl. No. 13/603,918, Sep. 2, 2014, 13 pages.
"Non-Final Office Action", U.S. Appl. No. 13/715,229, Aug. 19, 2014, 9 pages.
"Non-Final Office Action", U.S. Appl. No. 13/773,496, Jun. 23, 2014, 10 pages.
"Non-Final Office Action", U.S. Appl. No. 14/063,912, Sep. 2, 2014, 11 pages.
"Notice of Allowance", U.S. Appl. No. 13/471,030, Sep. 5, 2014, 6 pages.
"Restriction Requirement", U.S. Appl. No. 13/653,184, Sep. 5, 2014, 6 pages.
"Supplemental Notice of Allowance", U.S. Appl. No. 13/471,405, Aug. 29, 2014, 5 pages.
"Teach Me Simply", Retrieved From: <http://techmesimply.blogspot.in/2013/05/yugatech_3.html> on Nov. 22, 2013, May 3, 2013, pp. 1-6.
Chavan, et al., "Synthesis, Design and Analysis of a Novel Variable Lift Cam Follower System", In Proceedings: International Journal of Design Engineering, vol. 3, Issue 4, Inderscience Publishers,Jun. 3, 2010, 1 Page.
Justin, "Seidio Active with Kickstand for the Galaxy SIII", Retrieved From: <http://www.t3chniq.com/seidio-active-with-kickstand-gs3/> on Nov. 22, 2013, Jan. 3, 2013, 5 Pages.
Lahr, "Development of a Novel Cam-based Infinitely Variable Transmission", Proceedings: In Thesis of Master of Science in

(56) References Cited

OTHER PUBLICATIONS

Mechanical Engineering, Virginia Polytechnic Institute and State University, Nov. 6, 2009, 91 pages.
Lambert, "Cam Design", In Proceedings: Kinematics and dynamics of Machine, University of Waterloo Department of Mechanical Engineering, Jul. 2, 2002, pp. 51-60.
Lee, et al., "LED Light Coupler Design for a Ultra Thin Light Guide", Journal of the Optical Society of Korea, vol. 11, Issue.3, Retrieved from <http://opticslab.kongju.ac.kr/pdf/06.pdf>,Sep. 2007, 5 pages.
Sanap, et al., "Design and Analysis of Globoidal Cam Index Drive", Proceedings: In International Journal of Scientific Research Engineering & Technology, Jun. 2013, 6 Pages.
Siddiqui, "Hinge Mechanism for Rotatable Component Attachment", U.S. Appl. No. 13/852,848, filed Mar. 28, 2013, 51 pages.
"Corrected Notice of Allowance", U.S. Appl. No. 14/727,001, Jan. 25, 2016, 2 pages.
"Corrected Notice of Allowance", U.S. Appl. No. 14/727,001, Dec. 15, 2015, 2 pages.
"Extended European Search Report", EP Application No. 13858283.8, Nov. 23, 2015, 10 pages.
"Extended European Search Report", EP Application No. 13858674.8, Nov. 27, 2015, 6 pages.
"Extended European Search Report", EP Application No. 13861292.4, Nov. 23, 2015, 7 pages.
"Final Office Action", U.S. Appl. No. 13/471,336, Dec. 10, 2015, 17 pages.
"Foreign Office Action", CN Application No. 201310067373.6, Dec. 23, 2015, 15 Pages.
"Foreign Office Action", CN Application No. 201310067429.8, Nov. 25, 2015, 12 Pages.
"Foreign Office Action", CN Application No. 201310067631.0, Dec. 10, 2015, 11 Pages.
"Foreign Office Action", CN Application No. 201310067641.4, Dec. 30, 2015, 12 Pages.
"Notice of Allowance", U.S. Appl. No. 14/059,280, Nov. 23, 2015, 9 pages.
"Notice of Allowance", U.S. Appl. No. 14/727,001, Dec. 15, 2015, 2 pages.
"Restriction Requirement", U.S. Appl. No. 14/794,182, Dec. 22, 2015, 6 pages.
"Foreign Office Action", CN Application No. 201310067356.2, Feb. 4, 2016, 15 Pages.
"Non-Final Office Action", U.S. Appl. No. 14/794,182, Apr. 13, 2016, 15 pages.
"Non-Final Office Action", U.S. Appl. No. 14/994,737, Apr. 5, 2016, 6 pages.
"Notice of Allowance", U.S. Appl. No. 14/517,048, Feb. 24, 2016, 8 pages.
"Restriction Requirement", U.S. Appl. No. 14/307,262, Mar. 21, 2016, 6 pages.
"Corrected Notice of Allowance", U.S. Appl. No. 14/517,048, Apr. 13, 2016, 2 pages.
"Final Office Action", U.S. Appl. No. 14/225,250, Jan. 29, 2016, 10 pages.
Corrected Notice of Allowance, U.S. Appl. No. 13/527,263, Apr. 12, 2016, 2 pages.
Corrected Notice of Allowance, U.S. Appl. No. 13/527,263, Apr. 25, 2016, 2 pages.
Extended European Search Report, EP Application No. 13728568.0, Mar. 14, 2016, 16 pages.
Extended European Search Report, EP Application No. 13858403.2, Mar. 16, 2016, 12 pages.
Extended European Search Report, EP Application No. 13860271.9, May 4, 2016, 8 pages.
Extended European Search Report, EP Application No. 13861059.7, Apr. 29, 2016, 8 pages.
Final Office Action, U.S. Appl. No. 13/471,393, Mar. 9, 2016, 17 pages.
Final Office Action, U.S. Appl. No. 13/492,232, May 25, 2016, 12 pages.
Final Office Action, U.S. Appl. No. 13/780,228, Mar. 23, 2016, 16 pages.
Foreign Notice of Allowance, CN Application No. 201310065273.X, Mar. 31, 2016, 4 Pages.
Foreign Notice of Allowance, CN Application No. 201320097079.5, Apr. 1, 2016, 4 Pages.
Foreign Notice of Allowance, CN Application No. 201310067531.8, Jun. 7, 2016, 4 pages.
Foreign Notice of Allowance, CN Application No. 201310067592.4, May 17, 2016, 4 pages.
Foreign Notice of Allowance, CN Application No. 201310067808.7, May 4, 2016, 4 pages.
Foreign Office Action, CN Application No. 201310067385.9, Apr. 14, 2016, 14 Pages.
Foreign Office Action, CN Application No. 201310067627.4, May 3, 2016, 7 pages.
Foreign Office Action, CN Application No. 201310096345.7, May 25, 2016, 16 Pages.
Foreign Office Action, CN Application No. 201310316114.2, Apr. 18, 2016, 11 pages.
Foreign Office Action, CN Application No. 201380025290.9, May 10, 2016, 15 pages.
Non-Final Office Action, U.S. Appl. No. 13/653,218, Apr. 20, 2016, 17 pages.
Non-Final Office Action, U.S. Appl. No. 13/689,541, Apr. 14, 2016, 23 pages.
Non-Final Office Action, U.S. Appl. No. 14/162,529, Apr. 6, 2016, 17 pages.
Non-Final Office Action, U.S. Appl. No. 14/307,262, Apr. 20, 2016, 10 pages.
Notice of Allowance, U.S. Appl. No. 13/468,882, May 24, 2016, 5 pages.
Notice of Allowance, U.S. Appl. No. 13/470,951, Mar. 24, 2016, 8 pages.

* cited by examiner

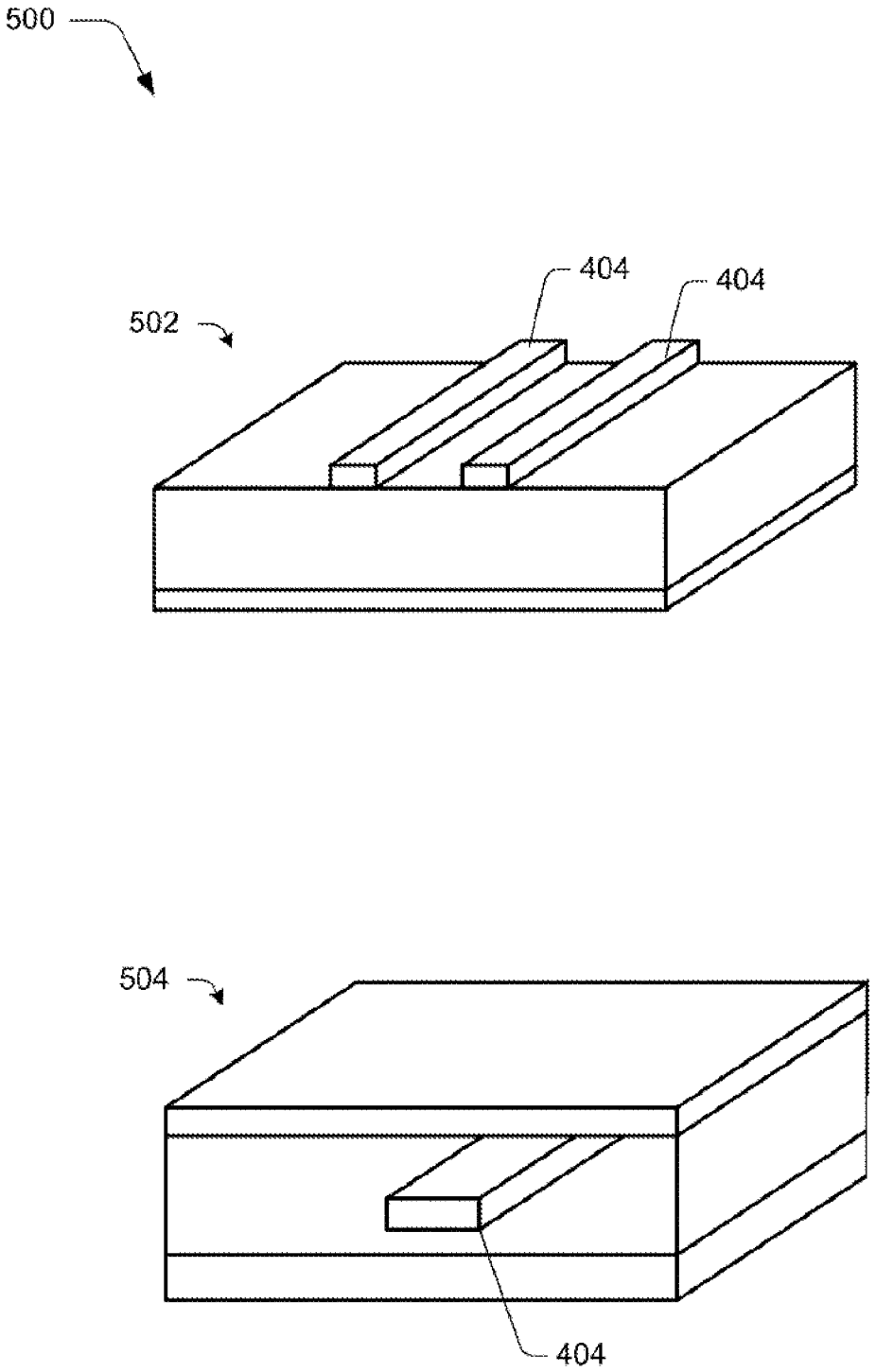
Fig. 5 (Amended)

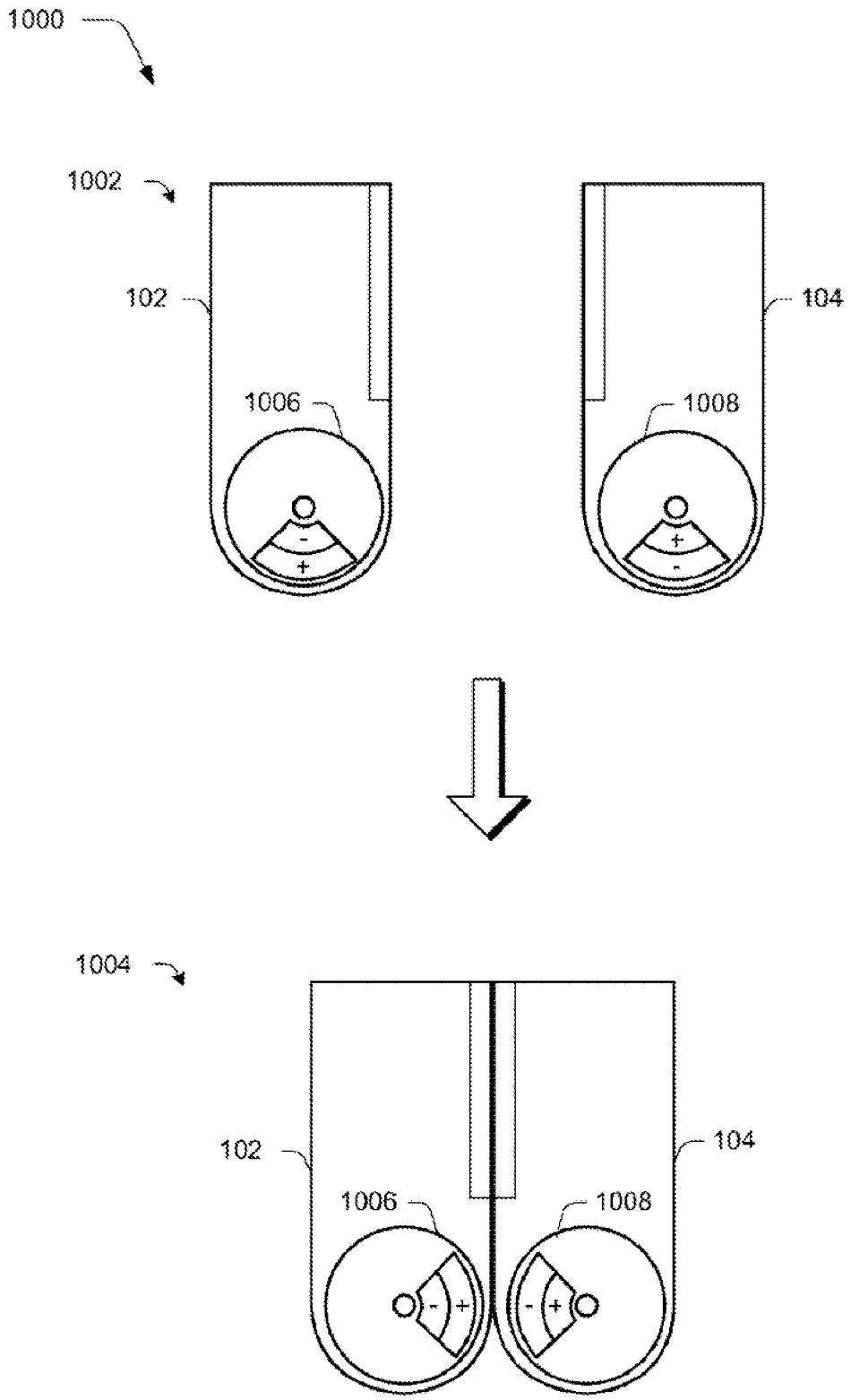
Fig. 10 (Amended)

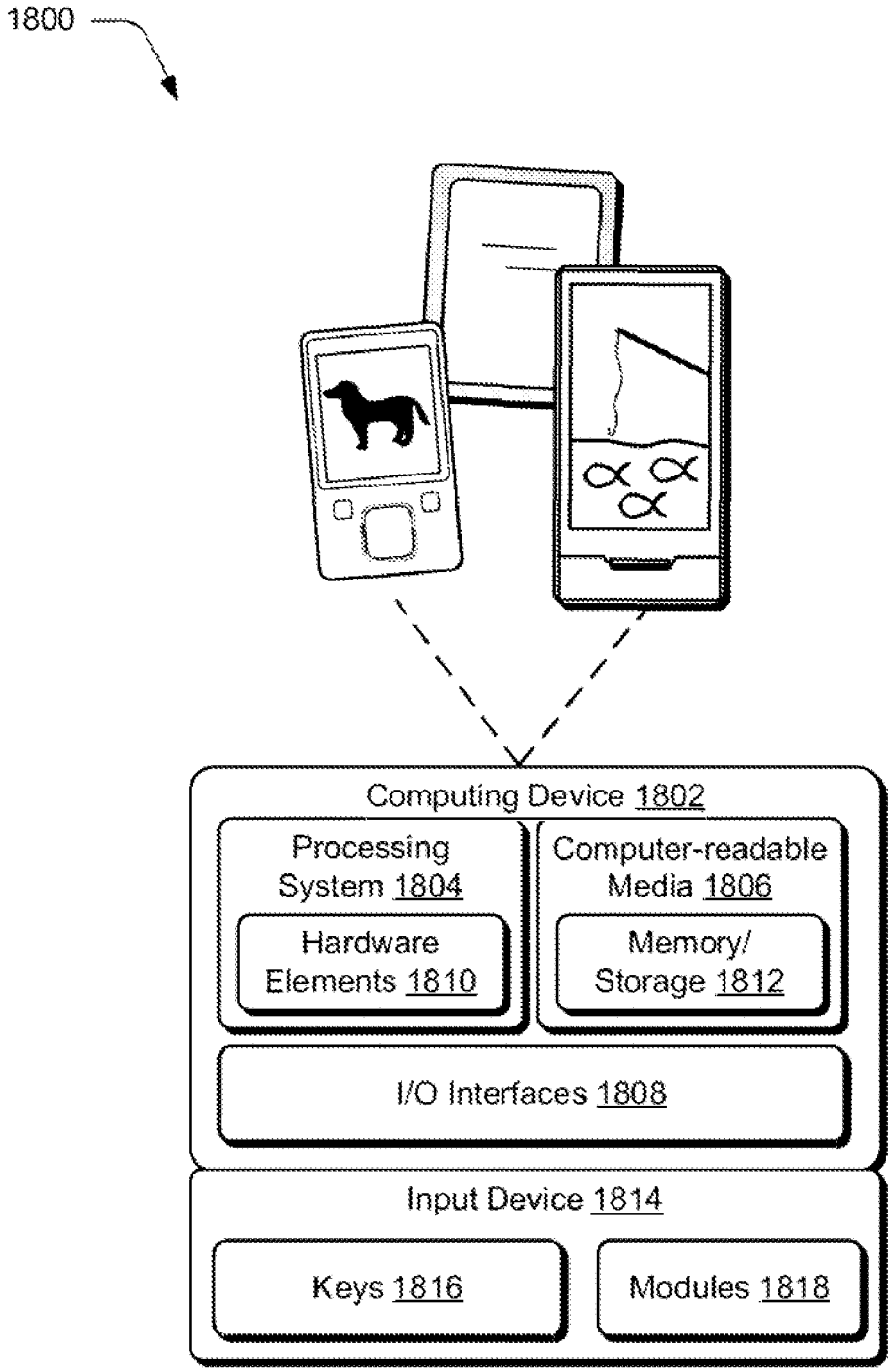
Fig. 18 (Amended)

CONNECTION DEVICE FOR COMPUTING DEVICES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application is a continuation-in-part and claims priority to U.S. patent application Ser. No. 13/470,633, filed May 14, 2012, entitled "Flexible Hinge and Removable Attachment," which further claims priority under 35 U.S.C. §119(e) to the following U.S. Provisional Patent Applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional."

BACKGROUND

Users have access to a wide variety of different computing devices. For example, a user may interact with a mobile phone, tablet computer, or other mobile computing device to check email, surf the web, compose texts, interact with applications, and so on.

However, conventional techniques that were utilized to interact with these devices were often limited to the individual devices, themselves. Consequently, even though a user may have access to a wide range of devices and may have that access at any one time (e.g., a mobile phone and a tablet), interaction with these devices could be disjointed, thereby leading to user frustration.

SUMMARY

A connection device for computing devices is described. In one or more implementations, a connection device comprises a plurality of connection portions that are physically and communicatively coupled, one to another. Each of the plurality of connection portions has at least one communication contact configured to form a communicative coupling with a respective one of a plurality of computing devices and with at least one other communication contact of another one of the connections portions to support communication between the plurality of computing devices. Each of the plurality of connection portions also includes a magnetic coupling device to form a removable magnetic attachment to the respective one of the plurality of computing devices.

In one or more implementations, a system includes a first computing device having a housing that assumes a slate configuration and a second computing device having a housing that assumes a slate configuration. The second computing device has a removable physical and communicative coupling with the second computing device, the removable physical communicative coupling provided at least in part through use of magnetism.

In one or more implementations, an apparatus comprises a plurality of connection portions that are configured to magnetically and physically communicatively couple a plurality of mobile computing devices having a slate form factor to each other.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

FIG. 5 depicts example implementations of the conductors that may be employed by the connection device to communicatively couple the connection portions to each other.

FIG. 10 depicts yet another example in which the computing devices include magnetic coupling portions configured as rotating magnetic hinges.

FIG. 18 illustrates an example system including various components of an example device that can be implemented as any type of computing device as described with reference to FIGS. 1-17 to implement embodiments of the techniques described herein.

DETAILED DESCRIPTION

Overview

Even though users may have access to a wide range of computing devices, conventional techniques to interact with these devices were provided by the computing devices separately. Accordingly, techniques are described herein to support physical and communicative connections between computing devices. For example, mobile computing devices such as tablets and phones may employ a slate form factor. A connection device may be used to provide a physical (e.g., magnetic) and communicative coupling between the devices, thereby permitting the devices to be used in combination, such as to expand an available display area, share processing and memory resources, and so on.

The connection device may be configured in a variety of ways. In one such example, the connection device includes a plurality of connection portions. Each of the connection portions is configured to connect to a respective computing device. This may be performed through a communication contact that is configured to support transmission bandwidths (e.g., hundreds of MHz) between the devices that are sufficient to communicate data for display without distortion, which may include the use of leaf springs, capacitive connections, optical connections, and so on.

A physical coupling may also be provided, at least in part, using magnets. The magnets, for instance, may be used to support a zero to negative insertion force to connect the computing device to the connection portion, e.g., such that the devices "click" together. Thus, a plurality of computing devices may be communicatively and physically coupled to the connection device, which may be used to support a variety of different usage scenarios, further discussion of which may be found in relation to the following sections.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures. Further, although connection of computing devices is described, other devices are also contemplated, such as covers. For example, these techniques are equally applicable to input devices and passive devices, e.g., a cover having one or more materials (e.g., magnets, ferrous material, and so on) that are configured and positioned within the cover to be attracted to magnetic coupling devices of the computing device, use of protrusions and connecting portion, and so on as further described below.

Example Environment

Figure 1:
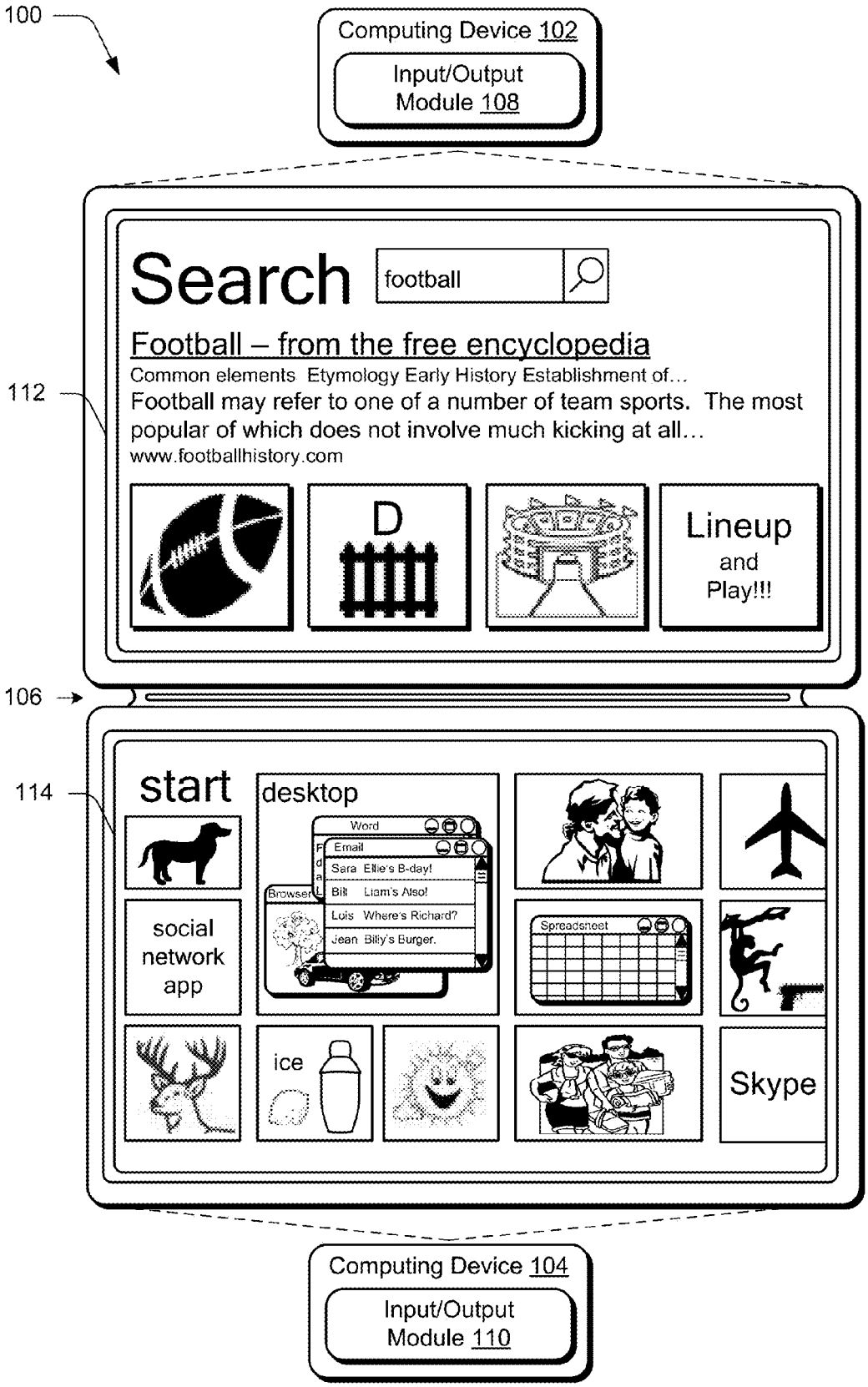
FIG. 1 is an illustration of an environment in an example implementation that is operable to employ the connection techniques described herein.

FIG. 1 is an illustration of an environment 100 in an example implementation that is operable to employ the connection device techniques described herein. The illustrated environment 100 includes examples of computing devices 102, 104 that are physically and communicatively coupled via a connection device 106. The computing devices 102, 104 may be configured in a variety of ways. For example, computing devices 102, 104 may be configured for mobile use and therefore be referred to as mobile computing devices, such as a mobile phone, a tablet computer as illustrated, a portable game device, a portable music device, and so on. Other non-mobile examples are also contemplated, such as laptop computers, desktop computers, servers, and so on. Thus, the computing devices 102, 104 may range from full resource devices with substantial memory and processor resources to a low-resource device with limited memory and/or processing resources. The computing devices 102, 104 may also relate to software that causes the computing devices 102, 104 to perform one or more operations.

The computing devices 102, 104, for instance, are each illustrated as including a respective input/output module 108, 110. The input/output modules 108, 110 are representative of functionality relating to processing of inputs and rendering outputs of the respective computing device 102, 104. A variety of different inputs may be processed by the input/output modules 108, 110 such as inputs relating to functions that correspond to keys of an accessory device, keys of a virtual keyboard displayed by the display devices 112, 114 to identify gestures and cause operations to be performed that correspond to the gestures that may be recognized through touchscreen functionality, and so forth. Thus, the input/output modules 108, 110 may support a variety of different input techniques by recognizing and leveraging a division between types of inputs including key presses, gestures, and so on.

The computing devices 102, 104 are illustrated as being physically and communicatively coupled through use of a connection device 106. The connection device 106 may thus be used to support a variety of different usage scenarios for the computing devices 102, 104. This may include use of the computing devices 102, 104 in a manner that mimics a multi-monitor setup, a parent/child control arrangement, and so on. This may also include sharing resources of the devices, such as processing, memory, network connection, and other resources. In the illustrated example, computing device 104 displays a start screen on the display device 114 that is usable to select applications for execution and display by the display device 112 of computing device 102 as well as on a display device 114 of the computing device 104, itself. The connection device 106 may be configured in a variety of ways to support this connection, an example of which is described as follows and shown in a corresponding figure.

Figure 2:
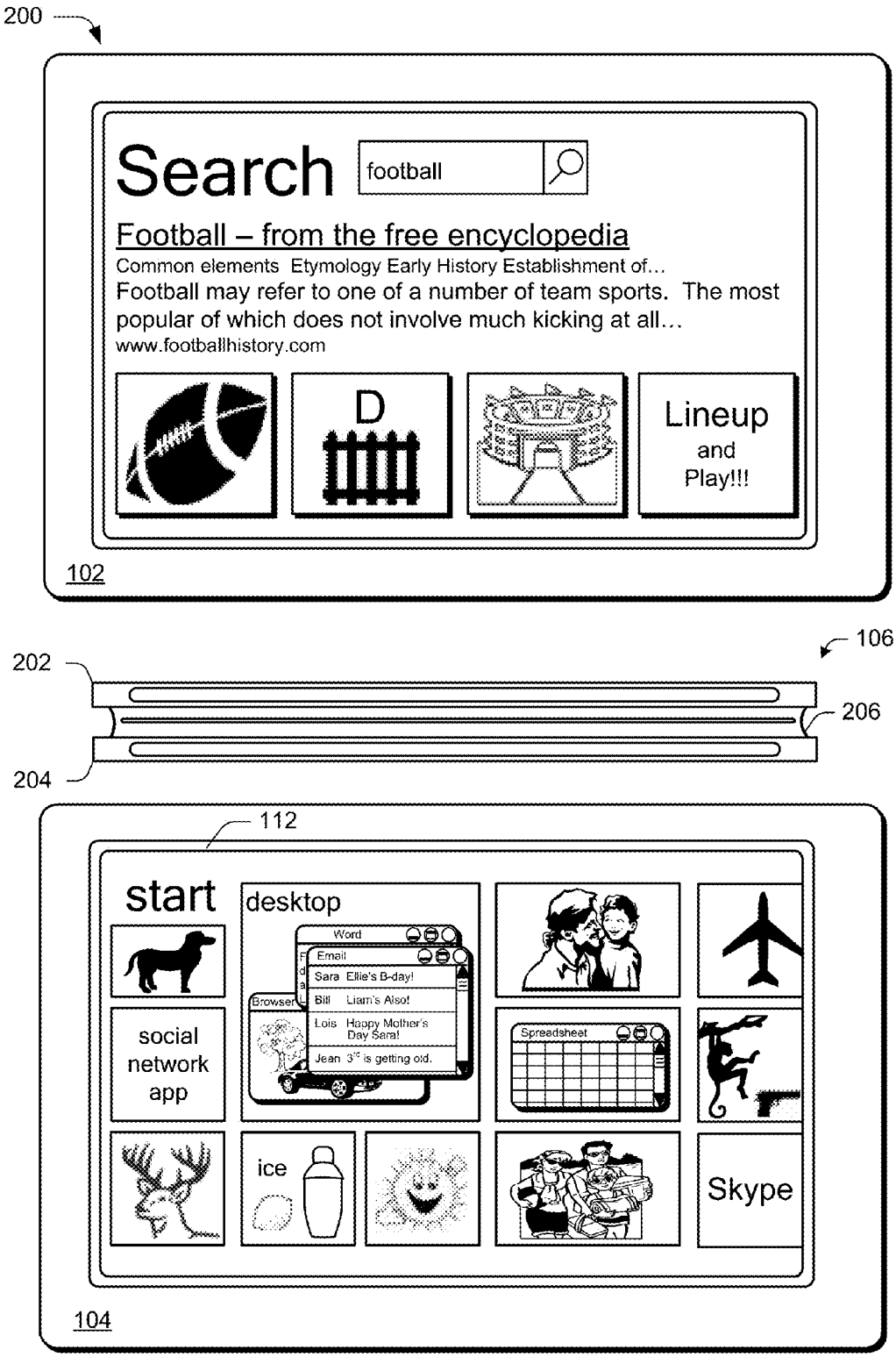
FIG. 2 depicts a system showing a connection device in greater detail that is usable to communicatively couple computing devices to each other.

FIG. 2 depicts a system 200 showing a connection device 202 in greater detail that is usable to communicatively couple the computing devices 102, 104 to each other. In this example, the connection device 106 includes a plurality of connection portions 202, 204. Each of the connection portions 202, 204 is configured to be received in a respective cavity of a respective computing device 102, 104. In the illustrated instance, the connection portions 202, 204 may be attached to the respective computing devices 102, 104 in either direction as the shapes of the portions is symmetrical.

The computing devices 102, 104 may be configured to use the cavities to support connections to peripheral devices, such as keyboard, input devices, electronic paper display devices, and so on. Accordingly, in this example the connection device 106 may be configured to leverage this connection to support a connection between computing devices as further described below.

The plurality of connection portions 202, 204 are communicatively coupled in this example using a flexible hinge 206. The flexible hinge 206 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one or more directions (e.g., vertically in the figure) yet restrict movement in other directions, such as lateral movement of the computing device 104 in relation to the computing device 102. This may be used to support consistent alignment of the computing devices 102, 104.

The flexible hinge 206, for instance, may be formed using one or more layers of fabric and include conductors formed as flexible traces to communicatively couple the input device 104 to the computing device 102 and vice versa. This communication, for instance, may be used to communicate inputs between the computing devices 102, 104, transfer power, perform authentication, and so on. The flexible hinge 206 may be configured in a variety of ways, further discussion of which may be found in relation to the following figure.

Figure 3:
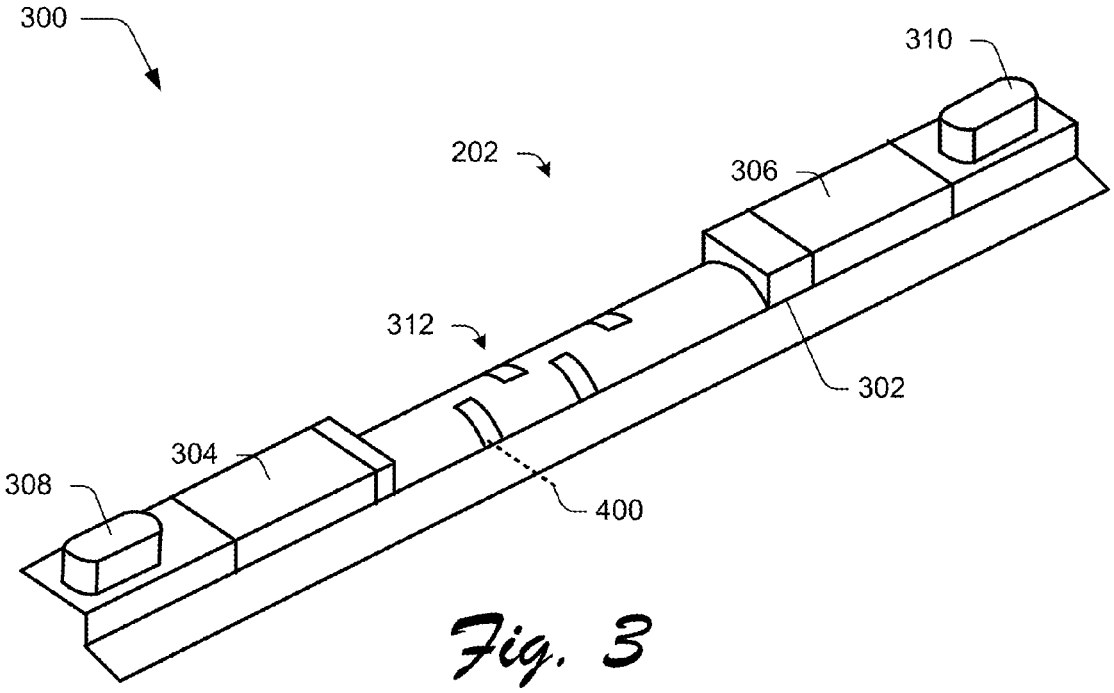
FIG. 3 depicts an example implementation of a connection portion of a connection device of FIG. 2.

FIG. 3 depicts an example implementation 300 of the connection portion 202 of the connection device 106 of FIG. 2. In this example, the connection portion 202 is illustrated as having a protrusion 302 that is configured to be received in a cavity of a corresponding computing device 102 as described above. The protrusion 302 includes magnetic coupling devices 304, 306, mechanical coupling protrusions (e.g., "fangs") 308, 310, and a plurality of communication contacts 312. The magnetic coupling devices 304, 306 are configured to magnetically couple to complementary magnetic coupling devices of the computing device 102 through use of one or more magnets. In this way, the connection portion 202 may be physically secured to the computing device 102 through use of magnetic attraction.

The connection portion 202 also includes mechanical coupling protrusions 308, 310 to form a mechanical physical connection between the connection portion 202 and the computing device 102. The mechanical coupling protrusions 308, 310 are configured to extend away from a surface of the connection portion 202, which in this case is perpendicular although other angles are also contemplated.

The mechanical coupling protrusions 308, 310 are configured to be received within complimentary cavities within a channel of the computing device 102. When so received, the mechanical coupling protrusions 308, 310 promote a mechanical binding between the devices when forces are applied that are not aligned with an axis that is defined as correspond to the height of the protrusions and the depth of the cavity. In this way, the connection portion 202 may be separated from the computing device in a motion similar to tearing a page from a book but mechanically binds when confronted with other motions, thereby promoting a secure connection between the devices.

The connection portion 202 is also illustrated as including a plurality of communication contacts 312. The plurality of communication contacts 312 is configured to contact corresponding communication contacts of the computing device 102 to form a communicative coupling between the devices as shown and discussed in greater detail in relation to the following figure.

Figure 4:
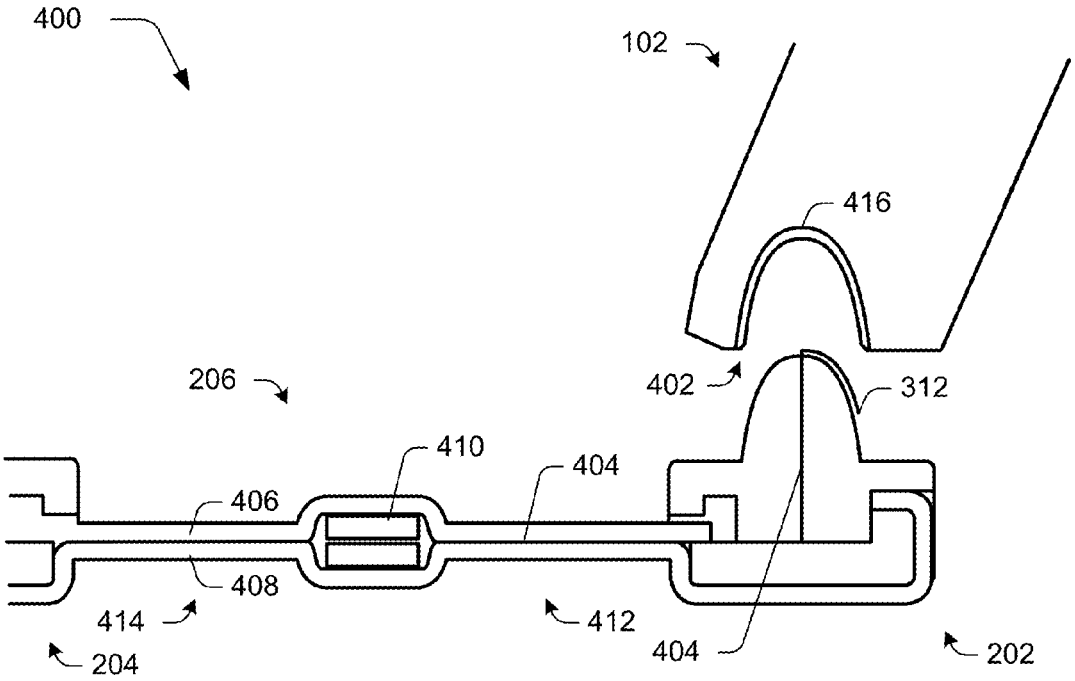
FIG. 4 depicts a cross section taken of the connection portion and a corresponding cavity of a computing device.

FIG. 4 depicts a cross section 400 taken of the connection portion 202 and a corresponding cavity 402 of the computing device. In this example, the flexible hinge 206 is also shown in greater detail. The flexible hinge 206 in this cross section includes a conductor 404 that is configured to communicatively couple the connection portions 202, 204 to each other. The conductor 404 may be formed in a variety of ways, such as a copper trace that has an operational flexibility to permit operation as part of the flexible hinge, e.g., to support repeated flexing of the flexible hinge 206. Flexibility of the conductor 404, however, may be limited, e.g., may remain operational to conduct signals for flexing that is performed above a minimum bend radius.

Accordingly, the flexible hinge 206 may be configured to support a minimum bend radius based on the operational flexibility of the conductor 404 such that the flexible hinge 206 resists flexing below that radius. A variety of different techniques may be employed. The flexible hinge 206, for instance, may be configured to include first and second outer layers 406, 408, which may be formed from a fabric, microfiber cloth, and so on. Flexibility of material used to form the first and/or second outer layers 406, 408 may be configured to support flexibility as described above such that the conductor 404 is not broken or otherwise rendered inoperable during movement of the connection portions 202, 204 in relation to each other.

In another instance, the flexible hinge 206 may include a mid-spine 410 located between the connection portions 202, 204. The mid-spine 410, for example, includes a first flexible portion [414] *412* that flexibly connects the connection portion 202 to the mid-spine 410 and a second flexible portion 414 that flexibly connects the mid-spine 410 to the other connection portion [420] *204*.

In the illustrated example, the first and second outer layers 406, 408 extend over the first and second flexible portions 412, 414 of the flexible hinge 206 and are secured to the connection portions 202, 204, e.g., via clamping, adhesive, and so on. The conductor 404 is disposed between the first and second outer layers 406, 408 with the mid-spine 410 configured to provide mechanical stiffness to a particular location of the flexible hinge 206 to support a desired minimum bend radius.

The communication contact 312 is also shown in cross section in this example. The communication contact 312 in this example is configured as a spring pin that support sliding movement as part of engagement with communication contacts 416 in the cavity of the computing device 102. This sliding motion may support surface cleaning of the communication contact 312, thereby promoting a robust connection.

The communication contact 312 may be formed in a variety of different ways. This may include use of electrical transmission line principles to avoid distortion of the digital waveforms to provide generally uniform impedance through use of differential pairs of communication contacts 312. A characteristic impedance may be set through controlled trace widths, trace-to-trace gaps, choice of dielectric material, and separations from a ground plane. Further, the communication contact 312 and/or conductor 404 may be disposed proximal to a dielectric that is adjacent to a ground plane to control impedance. Contact resistance of the communication contact 312 may also be configured. This in conventionally performed using a high insertion force to maintain a well-toleranced contact resistance.

However, in one or more implementations the connection portion 202 may be configured to employ a zero to negative insertion force. This may be performed by leveraging a clamping force provided by the magnetic coupling devices 304, 306 providing a zero to negative insertion force of the connection portion 202 to the computing device 102. In this way, the connection portion 202 and the computing device 102 may "click" together with alignment provided automatically through the magnetic coupling devices 304, 306. As shown in FIG. 4, for instance, a sliding and clamping motion may be supported in the same movement to connect the devices, thereby promoting consistent impedance and cleanliness of the communication contacts 312, 416.

Once connected, the computing devices may determine an orientation relative to each other, which may be used to configure a user interface that continues across the devices. For example, the orientation of the device may be deduced individually and separately, such as through use of one or more orientation sensors by the device and knowledge of location of where the communication contacts are disposed on the device. In this way, an orientation of the device may be determined as well as a like orientation of a connected device.

In another example, the two [device] *devices* may communicate with each other, such as to acknowledge a computed orientation, e.g., whether in portrait or landscape mode as well as to the "right" or "left", "top" or "bottom," and so on. Thus, this example may have increased robustness. Other examples are also contemplated.

FIG. 5 depicts example implementations 500 of the conductors 404 that may be employed by the connection device 106 to communicatively couple the connection portions 202, 204 to each other. In a first example 502, a microstrip transmission line is shown in which conductors 404 have widths, heights, and spacing to provide desired transmission properties.

In one or more implementations, placement of the magnetic coupling portions near the communication contacts 312 and conductors 404 may cause capacitance near these structures to be modified, which may cause impedance disturbance and distortion of signals transmitted by the conductors. Therefore, in the second example 504, a stripline transmission line is shown in which the conductor 404 is disposed between two ground planes. In this way, signals transmitted by the conductor 404 may be protected from modified capacitance that may be caused by the magnetic coupling devices 304, 306. A variety of other examples are also contemplated.

Figure 6:
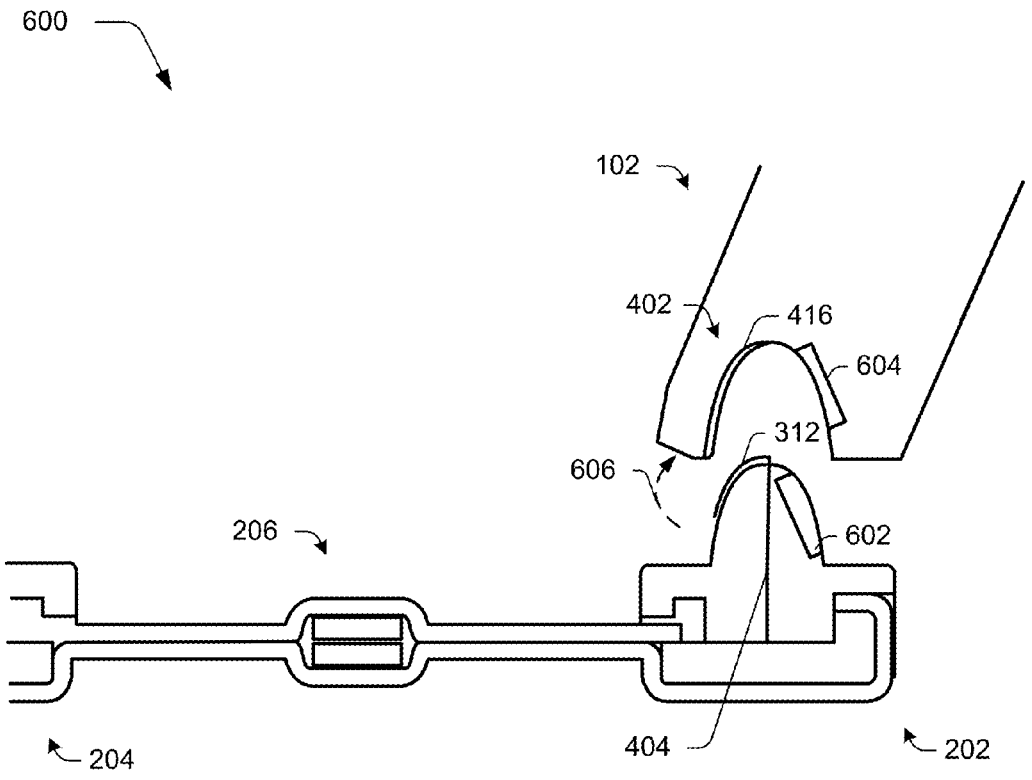
FIG. 6 depicts another example of a cross section taken of the connection portion and a corresponding cavity of the computing device, the connection portion configured to support cam-like movement.

FIG. 6 depicts another example 600 of a cross section taken of the connection portion 202 and a corresponding cavity 402 of the computing device 102, the connection portion 202 configured to support cam-like movement. As before, the connection portion 202 is configured as a protrusion that is to be received within a cavity 402 of a computing device 102 such that communication contacts 312, 416 form a communicative coupling.

In this example, the connection portion includes a magnet 602 that is configured to be attracted to a magnet 604 disposed as part of the cavity 402 of the computing device 102. Due to the curved surfaces of the connection portion 202 and the cavity 402, a cam action is caused by the attraction of the magnets 602, 604 such that the connection portion 202 rotates 606 in relation to the cavity 402. This rotation 606 causes the communication contact 312 to slide against the communication contact 416 of the computing device 102, thereby cleaning the surfaces of the contacts and promoting a consistent communicative coupling as previously described. In these examples, the communication contact 312 is configured as a leaf spring, other examples are also contemplated which are described as follows and shown in a corresponding figure.

Figure 7:
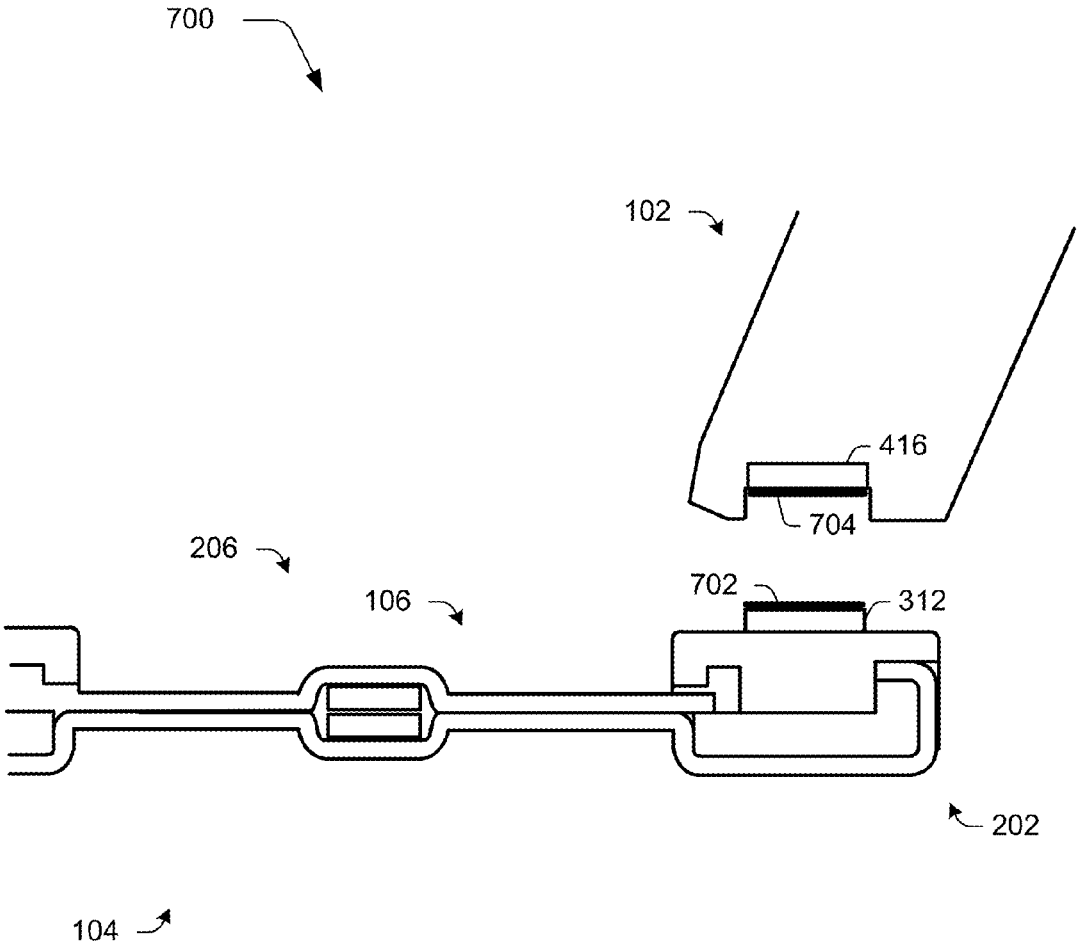
FIG. 7 depicts another example of a cross section taken of the connection portion and a corresponding cavity of the computing device in which communication contacts are configured as capacitive-coupling pads.

FIG. 7 depicts another example 700 of a cross section taken of the connection portion 202 and a corresponding cavity 402 of the computing device in which communication contacts 312, 416 are configured as capacitive-coupling pads. As before, the connection portion 202 is configured as a protrusion that is to be received within a cavity 402 of a computing device 102 such that communication contacts 312, 416 form a communicative coupling.

In this example, however, each of the communication contacts 312, 416 includes a dielectric 702, 704 disposed proximal to (e.g., covering) conductors of the communication contacts 312, 416. In this way, the communication contacts 312, 416 form AC-coupling capacitors, thereby avoiding issues such as a firm and clean physical contact between the communication contacts 312, 416.

Figure 8:
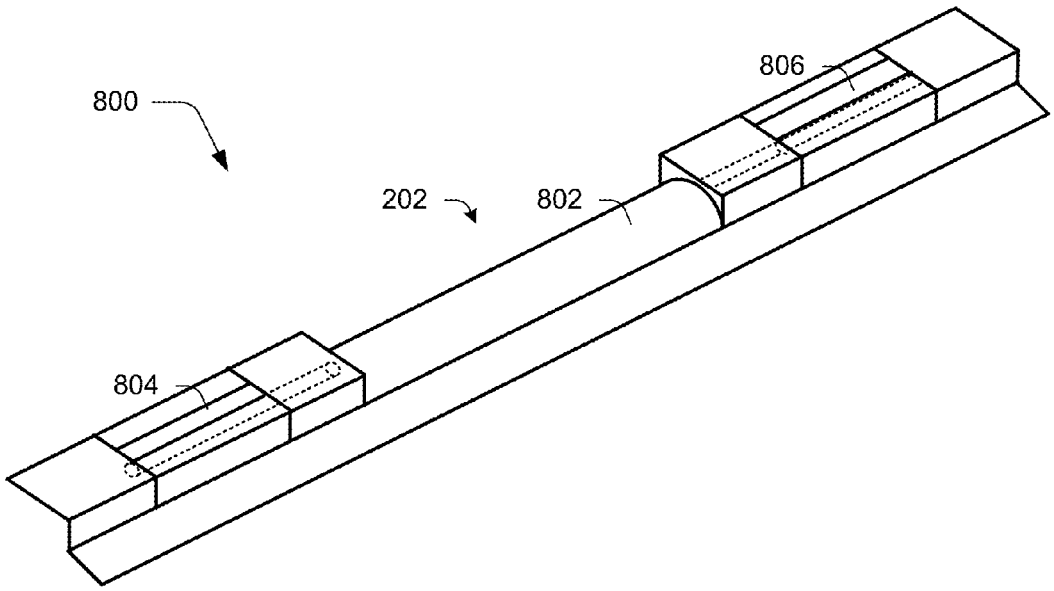
FIG. 8 depicts another example in which the connection portion is configured to support an optical connection.

FIG. 8 depicts another example 800 in which the connection portion 202 is configured to support an optical connection. In this example, the connection portion 202 includes a cover 802 and two cover rotation mechanisms 804, 806 that are coupled to the cover 802 using axles that are illustrated in phantom in the figure.

The two cover rotation mechanisms 804, 806 are configured to bias the cover 802 in the closed position as shown in FIG. 8, such as through use of one or more return springs. The cover rotation mechanisms 804, 806 include diametrically magnetized magnets that are configured to rotate the axles, which may be configured such that the magnets have magnetic field lines that are aligned at a right angle to a surface of the connection portion 202.

Therefore, the cover rotation mechanisms 804, 806 may be configured to rotate the cover 802 in the presence of a magnetic field having a corresponding alignment, e.g., from magnets of the computing device 102. A cylindrical magnet of the cover rotation mechanisms 804, 806, for instance, may rotate against a return force of a biasing mechanism (e.g., a spring) to align with the field lines of the adjacent magnet of the computing device 102, thereby opening the cover 802 as shown in the example implementation 900 of FIG. 9. Once the two devices are brought out of proximity, the biasing mechanism may cause the cover 802 to return to a closed position as shown in FIG. 8.

Figure 9:
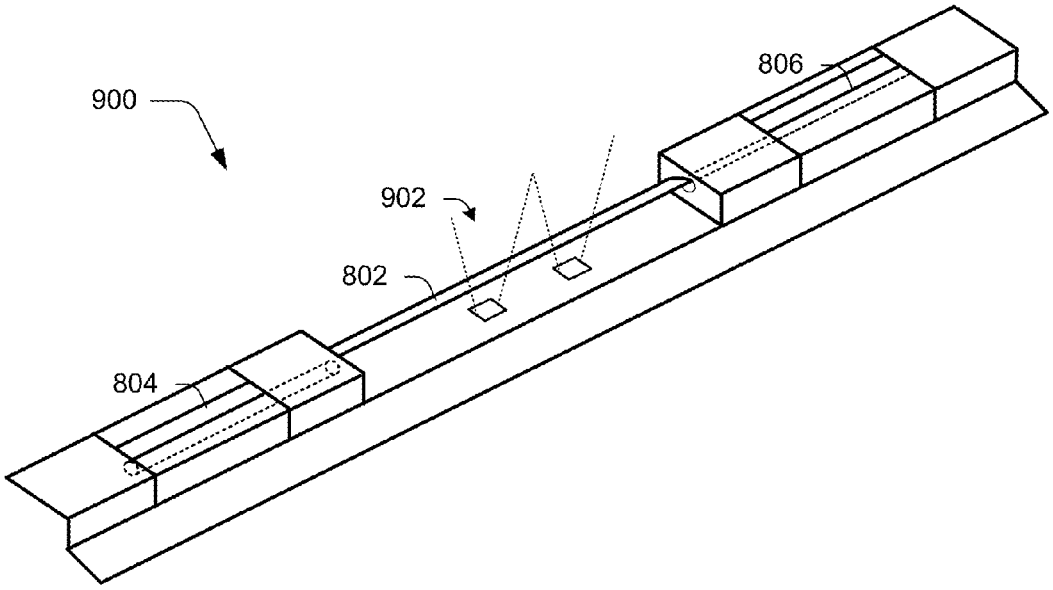
FIG. 9 shows an example in which a cover of FIG. 8 is opened to expose an optical sensor.

Once the cover 802 is opened as shown in FIG. 9, optical sensors 902 may be exposed on the connection portion 202 for communication with corresponding optical sensors of the computing device 102. In this way, the optical sensors 902 may be protected from contaminants and support a high bandwidth connection between the computing devices 102, 104.

FIG. 10 depicts yet another example 1000 in which the computing devices 102, 104 include magnetic coupling portions configured as rotating magnetic hinges. This example is shown through first and second stages 1002, 1004. At the first stage 1002, the magnetic coupling portions 1006, 1008 are integrated as part of the respective computing devices 102, 104. The magnetic coupling portions 1006, 1008 are configured to support hinge-able attachment of the devices to each other. Connections for data and power between the two computing devices 102, 104 may be connected to the same axle as the magnets so that the connections of the respective computing devices 102, 104 face each other when brought together.

The magnetic coupling portions 1006, 1008, for instance, may employ spring-loaded rotating magnets. The magnet polarity is S-symmetric around the center of the edge being joined so that an identical pair of computing devices 102, 104 may be connected by rotating one of the magnetic coupling portions 1006, 1008 at 180 degrees compared to the other, as shown in the second stage 1004. Thus, when the computing devices 102, 104 are brought together, the magnets rotate around their axis and pull the "hinge" together. Matching/interlocking dimples or ridges may also be employed for fine-grain alignment of the computing devices 102, 104 to each other. Thus, the magnets may rotate around an axis but are lightly spring-loaded to return to a neutral state as shown in the first stage. For sake of clarity in the figure, near-end magnet orientation is shown.

Figure 11:
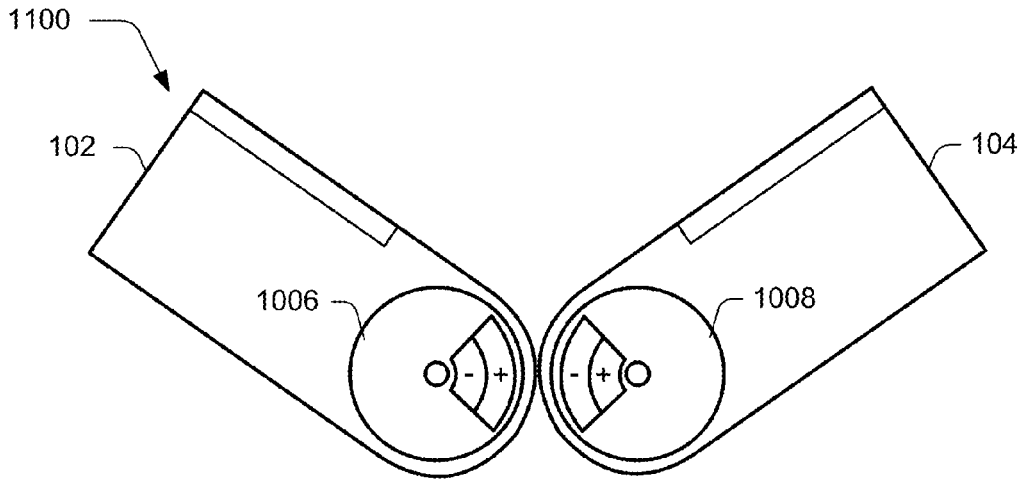
FIGS. 11-12 illustrate examples of rotation of the magnetic coupling portions in relation to each other may support a variety of different computing device orientations.
Figure 12:
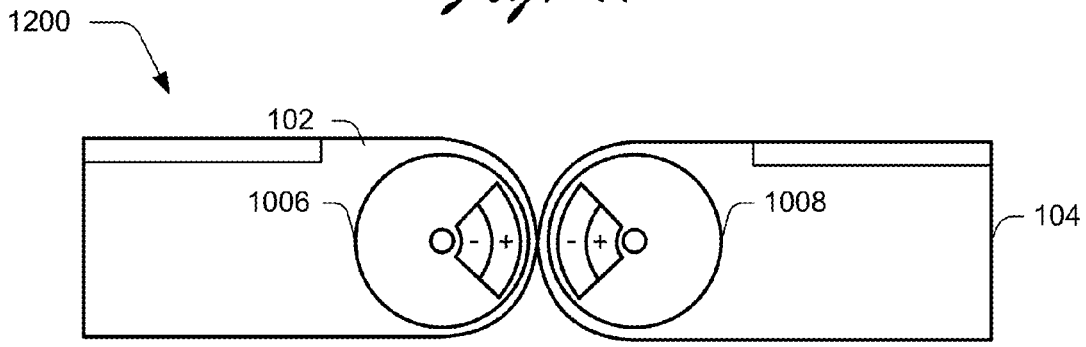
Figure 13:
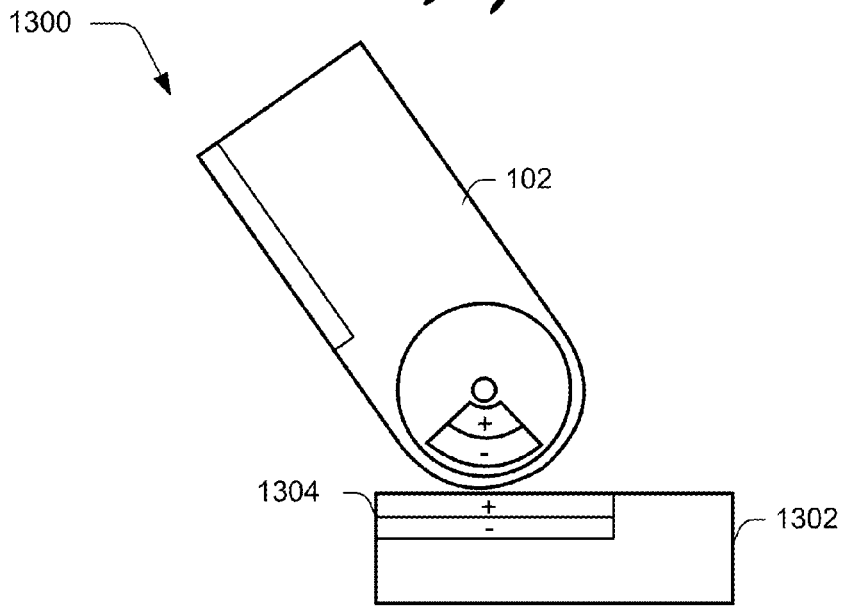
FIG. 13 depicts an example arrangement that supports a connection between the computing device and an accessory.

Rotation of the magnetic coupling portions 1006, 1008 in relation to each other may support a variety of different computing device 102, 104 orientations, examples 1100, 1200 are shown in FIGS. 11-12. In the example 1300 shown in FIG. 13, this arrangement may also be leveraged to support a connection between the computing device 102 and an accessory device 1302, such as a keyboard or other input device. The accessory device 1302 may also include a complementary arrangement of magnets 1304 to support a similar physical and communicative coupling. Although the magnets shown in the previous examples are cylindrical, the face configured to support the physical connection may also be configured as substantially flat, which may increase the strength of the magnetic connection.

Figure 14:
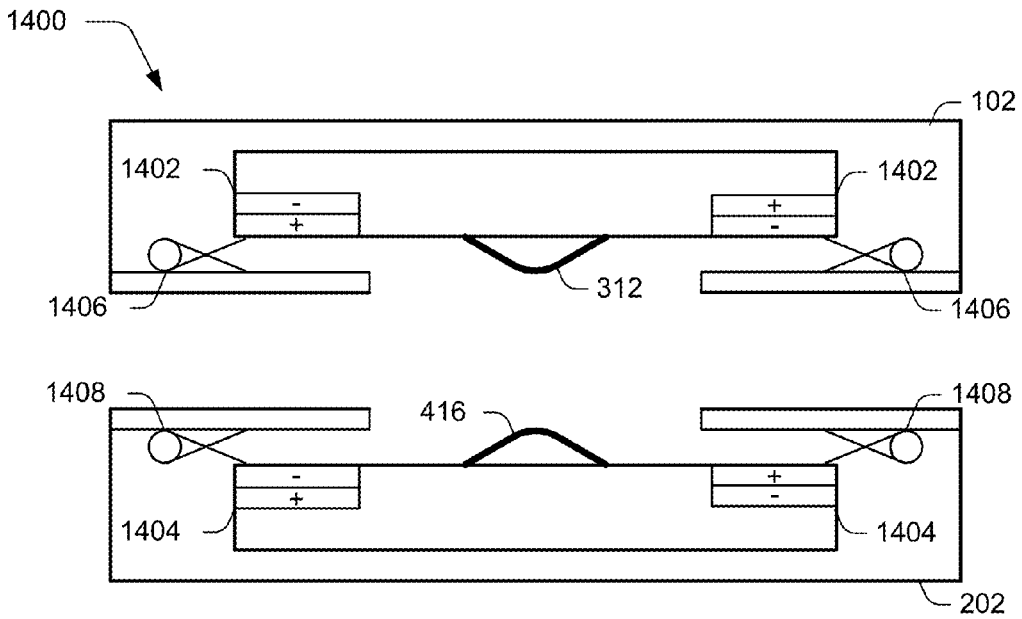
FIGS. 14 and 15 depict yet other examples in which the computing devices include magnetic coupling portions configured as rotating magnetic hinges.
Figure 15:
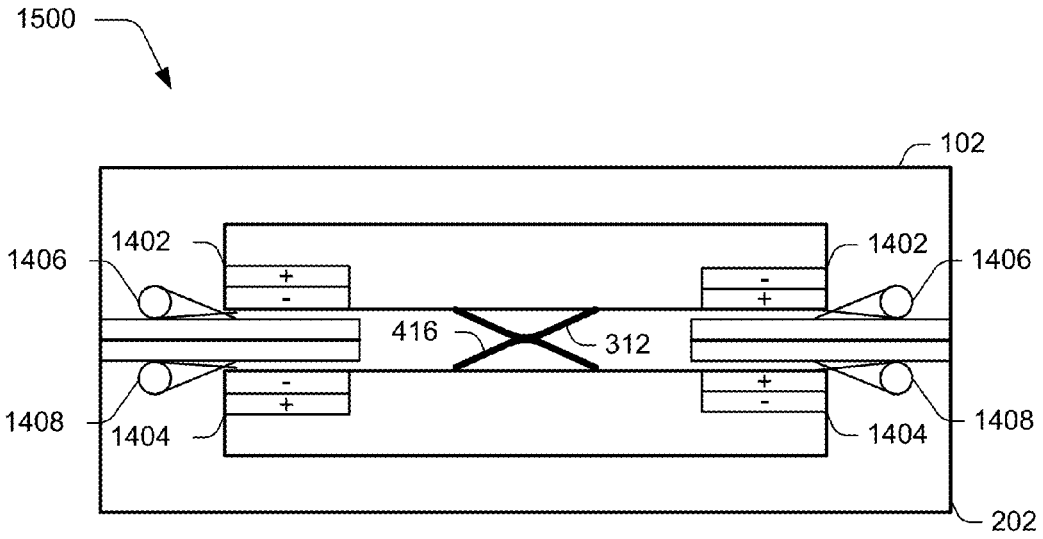

FIGS. 14 and 15 depict yet other examples 1400, 1500 in which the computing devices 102, 104 include magnetic coupling portions configured as rotating magnetic hinges. Communication contacts are generally kept relatively small for cost, real-estate, and impedance reasons and may be spring-loaded to maintain a consistent connection. Connecting surfaces of the communication contacts may be coated with a non-reactive, highly conductive metal such as gold, which may help maintain this functionality. However, this may leave a thin coating of metal over a small area that may be exposed to abrasion or snagging when the connector is not engaged. Further, in the case of connecting two identical computing devices directly, traditional socket/plug which could afford opportunities to recess the contacting surfaces may not "line up" for use in connection the devices directly.

Accordingly, the computing device 102 and connection portion 202 and/or another computing device 104 may employ retracting communication contacts 312, 416. The connection portion 202 and the computing device 102, for instance, may include magnetic coupling devices 1402, 1404 that are configured to be attracted to each other. The magnetic coupling devices 1402, 1404 and respective communication contacts 312, 416 may be disposed on a surface that is biased to a retracted state through one or more springs 1406, 1408 as shown in FIG. 14.

As the computing device 102 and connection portion 202 are brought together, however, attraction of the magnetic coupling devices 1402, 1404 to each other may cause the springs 1406, 1408 to compress and cause the communication contacts 312 to emerge and eventually touch as shown in the example 1500 of FIG. 15. In this way, the communication contacts 312, 416 may be protected from abrasion and contaminants yet still support a consistent connection between the devices. Once influence of the magnets is removed, the communication contacts 312, 416 may return to a retracted state as shown in FIG. 14. A variety of different configurations of magnets may be used as part of the magnetic coupling devices described in this example as well as the previous examples of FIGS. 1-13, further examples of which are described as follows and shown in a corresponding figure.

Figure 16:
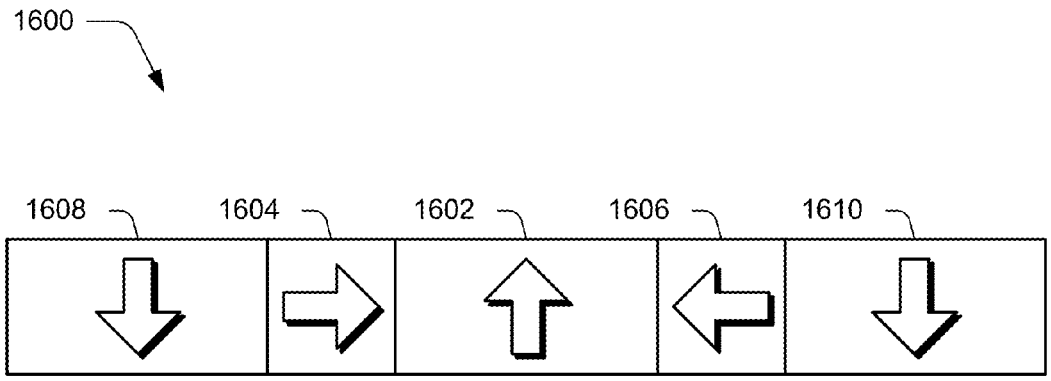
FIG. 16 depicts an example of a magnetic coupling portion that may be employed by the computing devices or connection device to implement a flux fountain.

FIG. 16 depicts an example 1600 of a magnetic coupling portion that may be employed by the connection device 106 or computing device 102 to implement a flux fountain. In this example, alignment of a magnet field is indicted for each of a plurality of magnets using arrows.

A first magnet 1602 is disposed in the magnetic coupling device having a magnetic field aligned along an axis. Second and third magnets 1604, 1606 are disposed on opposing sides of the first magnet 1602. The alignment of the respective magnetic fields of the second and third magnets 1604, 1606 is substantially perpendicular to the axis of the first magnet 1602 and generally opposed each other.

In this case, the magnetic fields of the second and third magnets are aimed towards the first magnet 1602. This causes the magnetic field of the first magnet 1602 to extend further along the indicated axis, thereby increasing a range of the magnetic field of the first magnet 1602.

The effect may be further extended using fourth and fifth magnets 1608, 1610. In this example, the fourth and fifth magnets 1608, 1610 have magnetic fields that are aligned as substantially opposite to the magnetic field of the first magnet 1602. Further, the second magnet 1604 is disposed between the fourth magnet 1608 and the first magnet 1602. The third magnet 1606 is disposed between the first magnet 1602 and the fifth magnet 1610. Thus, the magnetic fields of the fourth and fifth magnets 1608, 1610 may also be caused to extend further along their respective axes which may further increase the strength of these magnets as well as other magnets in the collection. This arrangement of five magnets is suitable to form a flux fountain. Although five magnets were described, any odd number of magnets of five and greater may repeat this relationship to form flux fountains of even greater strength.

To magnetically attach to another magnetic coupling device, a similar arrangement of magnets may be disposed "on top" or "below" of the illustrated arrangement, e.g., so the magnetic fields of the first, fourth and fifth magnets 1602, 1608, 1610 are aligned with corresponding magnets above or below those magnets. Further, in the illustrated example, the strength of the first, fourth, and fifth magnets 1602, 1608, 1610 is stronger than the second and third magnets 1604, 1606, although other implementations are also contemplated. Another example of a flux fountain is described in relation to the following discussion of the figure.

Figure 17:
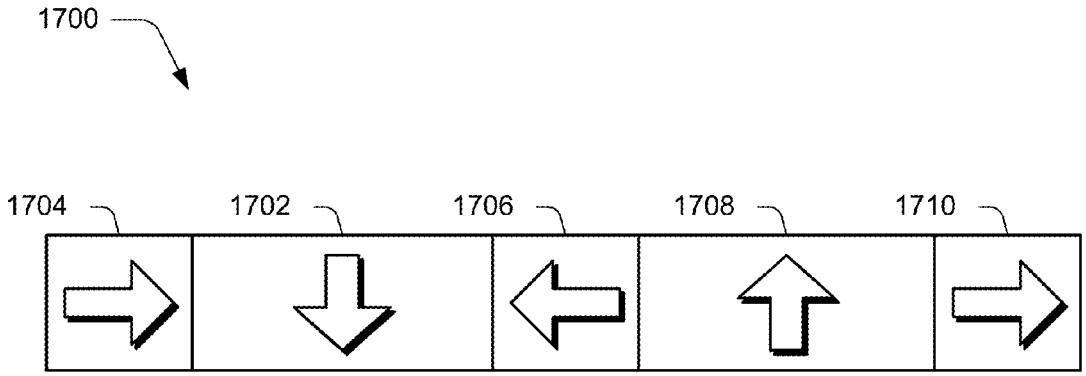
FIG. 17 depicts an example of a magnetic coupling portion that may be employed by the connection device or computing device to implement a flux fountain.

FIG. 17 depicts an example 1700 of a magnetic coupling portion that may be employed by the connection device 106 or computing device 102 to implement a flux fountain. In this example, alignment of a magnet field is also indicted for each of a plurality of magnets using arrows.

Like the example 1600 of FIG. 16, a first magnet 1702 is disposed in the magnetic coupling device having a magnetic field aligned along an axis. Second and third magnets 1704, 1706 are disposed on opposing sides of the first magnet 1702. The alignment of the magnetic fields of the second and third magnets 1704, 1706 are substantially perpendicular the axis of the first magnet 1702 and generally opposed each other like the example 1600 of FIG. 16.

In this case, the magnetic fields of the second and third magnets are aimed towards the first magnet 1702. This causes the magnetic field of the first magnet 1702 to extend further along the indicated axis, thereby increasing a range of the magnetic field of the first magnet 1702.

This effect may be further extended using fourth and fifth magnets 1708, 1710. In this example, the fourth magnet 1708 has a magnetic field that is aligned as substantially opposite to the magnetic field of the first magnet 1702. The fifth magnet 1710 has a magnetic field that is aligned as substantially corresponding to the magnet field of the second magnet 1704 and is substantially opposite to the magnetic field of the third magnet 1706. The fourth magnet 1708 is disposed between the third and fifth magnets 1706, 1710 in the magnetic coupling device.

This arrangement of five magnets is suitable to form a flux fountain. Although five magnets are described, any odd number of magnets of five and greater may repeat this relationship to form flux fountains of even greater strength. Thus, the magnetic fields of the first 1702 and fourth magnet 1708 may also be caused to extend further along its axis which may further increase the strength of this magnet.

To magnetically attach to another magnetic coupling device, a similar arrangement of magnets may be disposed "on top" or "below" of the illustrated arrangement, e.g., so the magnetic fields of the first and fourth magnets 1702, 1708 are aligned with corresponding magnets above or below those magnets. Further, in the illustrated example, the strength of the first and fourth magnets 1702, 1708 (individually) is stronger than a strength of the second, third and fifth magnets 1704, 1706, 1710, although other implementations are also contemplated.

Further, the example 1600 of FIG. 16, using similar sizes of magnets, may have increased magnetic coupling as opposed to the example 1700 of FIG. 17. For instance, the example 1600 of FIG. 16 uses three magnets (e.g. the first, fourth, and fifth magnets 1602, 1608, 1610) to primarily provide the magnetic coupling, with two magnets used to "steer" the magnetic fields of those magnets, e.g., the second and third magnets 1604, 1606. However, the example 1700 of FIG. 17 uses two magnets (e.g., the first and fourth magnets 1702, 1708) to primarily provide the magnetic coupling, with three magnets used to "steer" the magnetic fields of those magnets, e.g., the second, third, and fifth magnets 1704, 1706, 1708.

Accordingly, though, the example 1700 of FIG. 17, using similar sizes of magnets, may have increased magnetic alignment capabilities as opposed to the example 1600 of FIG. 16. For instance, the example 1700 of FIG. 17 uses three magnets (e.g. the second, third, and fifth magnets 1704, 1706, 1710) to "steer" the magnetic fields of the first and fourth magnets 1702, 1708, which are used to provide primary magnetic coupling. Therefore, the alignment of the fields of the magnets in the example 1700 of FIG. 17 may be closer than the alignment of the example 1600 of FIG. 16.

Regardless of the technique employed, it should be readily apparent that the "steering" or "aiming" of the magnetic fields described may be used to increase an effective range of the magnets, e.g., in comparison with the use of the magnets having similar strengths by themselves in a conventional aligned state. In one or more implementations, this causes an increase from a few millimeters using an amount of magnetic material to a few centimeters using the same amount of magnetic material.

Example System and Device

FIG. 18 illustrates an example system generally at 1800 that includes an example computing device 1802 that is representative of one or more computing systems and/or devices that may implement the various techniques described herein. The computing device 1802 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 1802 as illustrated includes a processing system 1804, one or more computer-readable media 1806, and one or more I/O interface 1808 that are communicatively coupled, one to another. Although not shown, the computing device 1802 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1804 is representative of functionality to perform one or more operations using hardware. Accordingly, the processing system 1804 is illustrated as including hardware element 1810 that may be configured as processors, functional blocks, and so forth. This may include implementation in hardware as an application specific integrated circuit or other logic device formed using one or more semiconductors. The hardware elements 1810 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1806 is illustrated as including memory/storage 1812. The memory/storage 1812 represents memory/storage capacity associated with one or more computer-readable media. The memory/storage component 1812 may include volatile media (such as random access memory (RAM)) and/or nonvolatile media (such as read only memory (ROM), Flash memory, optical disks, magnetic disks, and so forth). The memory/storage component 1812 may include fixed media (e.g., RAM, ROM, a fixed hard drive, and so on) as well as removable media (e.g., Flash memory, a removable hard drive, an optical disc, and so forth). The computer-readable media 1806 may be configured in a variety of other ways as further described below.

Input/output interface(s) 1808 are representative of functionality to allow a user to enter commands and information to computing device 1802, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1802 may be configured in a variety of ways to support user interaction.

The computing device 1802 is further illustrated as being communicatively and physically coupled to an input device 1814 that is physically and communicatively removable from the computing device 1802. In this way, a variety of different input devices may be coupled to the computing device 1802 having a wide variety of configurations to support a wide variety of functionality. In this example, the input device 1814 includes one or more keys 1816, which may be configured as pressure sensitive keys, mechanically switched keys, and so forth.

The input device 1814 is further illustrated as include one or more modules 1818 that may be configured to support a variety of functionality. The one or more modules 1818, for instance, may be configured to process analog and/or digital signals received from the keys 1816 to determine whether a keystroke was intended, determine whether an input is indicative of resting pressure, support authentication of the input device 1814 for operation with the computing device 1802, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1802. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1802, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1810 and computer-readable media 1806 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1810. The computing device 1802 may be configured to implement particular instructions and/or functions corresponding to the software and/or hardware modules. Accordingly, implementation of a module that is executable by the computing device 1802 as software may be achieved at least partially in hardware, e.g., through use of computer-readable storage media and/or hardware elements 1810 of the processing system 1804. The instructions and/or functions may be executable/operable by one or more articles of manufacture (for example, one or more computing devices 1802 and/or processing systems 1804) to implement techniques, modules, and examples described herein.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A connection device comprising:

a plurality of connection portions that are physically and communicatively coupled, one to another, [the plurality of connection portions connected using a flexible hinge,] each of the plurality of connection portions having:

at least one communication contact configured to form a communicative coupling with a respective one of a plurality of computing devices and with at least one other communication contact of another one of the connections portions to support communication between the plurality of computing devices[, the flexible hinge having one or more conductors configured to communicatively couple the at least one communication contact with the at least one other communication contact]; [and]

a magnetic coupling device to form a removable magnetic attachment to the respective one of the plurality of computing devices;

*a flexible hinge connecting the plurality of connection portions, the flexible hinge including:*

*a first connection portion of the plurality of connection portions;*

*a second connection portion of the plurality of connection portions;*

*a first outer layer extending between and secured to the first connection portion and the second connection portion;*

*a second outer layer extending between and secured to the first connection portion and the second connection portion;*

*a mid-spine between the first connection portion and the second connection portion, the mid-spine being located between the first outer layer and the second outer layer, the mid-spine being made from a stiffer material than the first outer layer and the second outer layer;*

*a first flexible portion between the first connection portion and the mid-spine;*

*a second flexible portion between the mid-spine and the second connection portion; and*

*one or more conductors disposed between the first outer layer and the second outer layer, the one or more conductors being configured to communicatively couple the at least one communication contact with the at least one other communication contact.*

2. A connection device described in claim 1, wherein the flexible hinge is configured not to exceed a minimum bend radius that is defined at least in part based on flexibility of the one or more conductors.

3. A connection device as described in claim 1, wherein at least one of the plurality of connection portions is configured as a projection that is configured to be received within a channel of a housing of the respective one of the plurality of computing devices, the projection including the at least one communication contact and the magnetic coupling device.

4. A connection device as described in claim 1, wherein the plurality of computing devices include housings that support a slate configuration.

5. A connection device as described in claim 1, wherein the at least one communication contact is configured to support sliding motion as part of a physical coupling of the communication contact to the respective one of the plurality of computing devices, the sliding motion configured to at least partially clean a surface of the at least one communication contact.

6. A connection device as described in claim 5, wherein the sliding motion is configured to be assisted at least in part using magnetic attraction of the magnetic coupling device to the respective one of the plurality of computing devices.

7. A connection device as described in claim 1, wherein the at least one communication contact is configured to include a spring.

8. A connection device as described in claim 1, wherein at least one of the plurality of connection portions is formed such that the magnetic coupling device causes the respective connection portion to employ a cam action to support rotational movement as part of engagement of the at least one communication contact with the respective one of the plurality of computing devices.

9. A connection device as described in claim 1, wherein the at least one communication contact includes a dielectric coating in an amount sufficient to form a capacitive connection with a corresponding contact of the respective one of the plurality of computing devices.

10. A connection device as described in claim 1, wherein the at least one communication contact is configured to support an optical connection.

11. A connection device as described in claim 1, wherein at least one of the plurality of connection portions includes a rotating cover on an axle that is biased in a closed position and is configured to assume an open position in which the at least one communication contact is exposed responsive to a magnetic field.

12. A connection device as described in claim 1, wherein the at least one communication contact and the at least one other communication contact are connected using one or more conductors configured as strip lines.

[13. A connection device as described in claim 1, wherein the magnetic coupling device has one or more rotatable magnets that have a symmetric magnetic polarity.]

14. A connection device as described in claim 1, wherein the at least one communication contact is configured to be moveable with respect to the respective connection portion between a retracted position and an exposed position responsive to magnetic interaction.

15. A connection device as described in claim 1, wherein the magnetic coupling device is configured as a flux fountain.

16. A system comprising:

a first computing device having a housing that assumes a slate configuration; and a second computing device having a housing that assumes a slate configuration, the second computing device having*:* a removable physical and communicative coupling with the first computing device, the removable physical communicative coupling provided at least in part through [use of]*:* a flexible hinge physically and communicatively coupling a plurality of connection portions, one to another, each of the plurality of connection portions having at least one communication contact configured to form a communicative coupling with the first computing device and at least one other communication contact configured to form a communicative coupling with the second computing device, the flexible hinge having*:*

*a first connection portion of the plurality of connection portions;*

*a second connection portion of the plurality of connection portions;*

*a first outer layer extending between and secured to the first connection portion and the second connection portion;*

*a second outer layer extending between and secured to the first connection portion and the second connection portion;*

*a mid-spine between the first connection portion and the second connection portion, the mid-spine being located between the first outer layer and the second outer layer, the mid-spine being made from a stiffer material than the first outer layer and the second outer layer;*

*a first flexible portion between the first connection portion and the mid-spine;*

*a second flexible portion between the mid-spine and the second connection portion; and* one or more conductors *between the first outer layer and the second outer layer, the one or more conductors being* configured to communicatively couple the at least one communication contact with the at least one other communication contact.

[17. A system as described in claim 16, wherein the flexible hinge has one or more rotatable magnets that have a symmetric magnetic polarity.]

18. A system as described in claim 16, wherein the flexible hinge is configured not to exceed a minimum bend radius that is defined at least in part based on flexibility of the one or more conductors.

19. An apparatus comprising*:* a plurality of connection portions that are configured to magnetically and physically communicatively couple a plurality of mobile computing devices having a slate form factor to each other, the plurality of connection portions connected using*:* a flexible hinge having*:*

*a first connection portion of the plurality of connection portions;*

*a second connection portion of the plurality of connection portions;*

*a first outer layer extending between and secured to the first connection portion and the second connection portion;*

*a second outer layer extending between and secured to the first connection portion and the second connection portion;*

*a mid-spine between the first connection portion and the second connection portion, the mid-spine being located between the first outer layer and the second outer layer, the mid-spine being made from a stiffer material than the first outer layer and the second outer layer;*

*a first flexible portion between the first connection portion and the mid-spine;*

*a second flexible portion between the mid-spine and the second connection portion; and* one or more conductors *located between the first outer layer and the second outer layer and* configured to communicatively couple at least one communication contact configured to form a communicative coupling with a respective one of the plurality of mobile computing devices with at least one other communication contact of another one of the connections portions.

20. An apparatus as described in claim 19, wherein the magnetic coupling is provided by a magnetic coupling device configured to form a removable magnetic attachment to the respective one of the plurality of mobile computing devices, the removable magnetic attachment configured to provide a zero or negative insertion force of the connection portion to the respective one of the plurality of computing devices.

* * * * *